(12) United States Patent
Cideciyan et al.

(10) Patent No.: US 9,712,188 B2
(45) Date of Patent: Jul. 18, 2017

(54) DECODING DATA STORED WITH THREE ORTHOGONAL CODEWORDS

(71) Applicant: International Business Machines Corporation, Armonk, NY (US)

(72) Inventors: Roy D. Cideciyan, Rueschlikon (CH); Simeon Furrer, Altdorf (CH); Robert A. Hutchins, Tucson, AZ (US); Mark A. Lantz, Adliswil (CH)

(73) Assignee: International Business Machines Corporation, Armonk, NY (US)

( * ) Notice: Subject to any disclaimer, the term of this patent is extended or adjusted under 35 U.S.C. 154(b) by 40 days.

(21) Appl. No.: 14/703,756

(22) Filed: May 4, 2015

(65) Prior Publication Data

US 2016/0329914 A1 Nov. 10, 2016

(51) Int. Cl.
*H03M 13/29* (2006.01)
*G06F 11/10* (2006.01)
*G11B 20/18* (2006.01)
*H03M 13/00* (2006.01)
*H03M 13/53* (2006.01)

(52) U.S. Cl.
CPC ..... *H03M 13/2909* (2013.01); *G06F 11/1076* (2013.01); *G11B 20/1833* (2013.01); *H03M 13/616* (2013.01)

(58) Field of Classification Search
CPC ............ H03M 13/2909; H03M 13/616; G06F 11/1076; G11B 20/1833
See application file for complete search history.

(56) References Cited

U.S. PATENT DOCUMENTS

| 5,463,660 | A | * | 10/1995 | Fukasawa | H04B 1/71075 370/203 |
|---|---|---|---|---|---|
| 6,732,325 | B1 | | 5/2004 | Tash et al. | |
| 7,362,734 | B1 | | 4/2008 | Samaras et al. | |
| 7,386,780 | B2 | | 6/2008 | Krachkovsky et al. | |
| 8,095,854 | B2 | | 1/2012 | Eroz et al. | |
| 8,108,752 | B2 | | 1/2012 | Tanaka | |
| 8,276,045 | B2 | | 9/2012 | Cideciyan et al. | |
| 8,300,687 | B1 | | 10/2012 | Eliezer | |
| 8,332,716 | B2 | | 12/2012 | Jego et al. | |
| 8,340,211 | B2 | | 12/2012 | Josiam et al. | |
| 8,370,700 | B2 | | 2/2013 | Xu et al. | |

(Continued)

OTHER PUBLICATIONS

Cideciyan et al., U.S. Appl. No. 14/702,861, filed May 4, 2015.
(Continued)

*Primary Examiner* — April Y Blair
*Assistant Examiner* — Dipakkumar Gandhi
(74) *Attorney, Agent, or Firm* — Zilka-Kotab, P.C.

(57) ABSTRACT

In one embodiment, a method includes reading packets of data from M parallel data tracks of a magnetic tape to obtain a plurality of (D+P)-symbol codewords which are logically arranged in nM encoded blocks, each packet including a row of an encoded block, where each encoded block includes an array having rows and columns of code symbols, wherein symbols of each of the (D+P)-symbol codewords are distributed over corresponding rows of the nM encoded blocks, decoding sub-blocks from rows and columns of a plurality of product codewords from the nM encoded blocks, each product codeword including a logical array of code symbols having the rows which include respective row codewords and the columns which include respective column codewords, where each sub-block includes a logical array having rows and columns of data symbols, combining the sub-blocks to form a block of data, and outputting the block of data.

21 Claims, 20 Drawing Sheets

(56) References Cited

U.S. PATENT DOCUMENTS

| | | | |
|---|---|---|---|
| 8,599,959 | B2 | 12/2013 | Krachkovsky et al. |
| 8,627,187 | B2 | 1/2014 | Chappaz |
| 8,762,805 | B2 | 6/2014 | Cideciyan et al. |
| 9,231,622 | B2 | 1/2016 | Wang |
| 9,606,868 | B2 | 3/2017 | Cideciyan et al. |
| 9,612,905 | B2 | 4/2017 | Cideciyan et al. |
| 2005/0273688 | A1* | 12/2005 | Argon .................. H04L 1/0063 714/755 |
| 2008/0034272 | A1* | 2/2008 | Wu ..................... G06F 11/1068 714/763 |
| 2013/0326306 | A1 | 12/2013 | Cideciyan et al. |
| 2014/0108881 | A1 | 4/2014 | Blaum et al. |
| 2014/0189461 | A1 | 7/2014 | Cideciyan et al. |
| 2016/0328292 | A1 | 11/2016 | Cideciyan et al. |
| 2016/0329913 | A1 | 11/2016 | Cideciyan et al. |

OTHER PUBLICATIONS

List of IBM Patents Or Patent Applications Treated As Related.

Non-Final Office Action from U.S Appl. No. 14/702,861, dated Jun. 9, 2016.

Final Office Action from U.S. Appl. No. 14/702,861, Sep. 23, 2016.

Cideciyan et al.. U.S. Appl. No. 14/984,086, filed Dec. 30, 2015.

Non-Final Office Action from U.S. Appl. No. 14/984,086, dated Jun. 9, 2016.

Final Office Action from U.S. Appl. No. 14/984,086, Sep. 29, 2016.

Gallagher, R., "Low-Density Parity-Check Codes," from http://web.mit.edu/gallager/www/pages/ldpc.pdf, 1963 p. 1-90.

Geisel, W., "Tutorial on Reed-Solomon Error Correction Coding," NASA Technical Memorandum 102162, Aug. 1990, 144 pages.

Anonymous, "Expanded Sub Data Set for Magnetic Tape Recording," IP.com No. 000223249, Nov. 13, 2012, pp. 1-6.

Arslan et al., "MDS Product Code Performance Estimations Under Header CRC Check Failures and Missing Syncs," IEEE Transactions on Device and Materials Reliability, vol. 14, No. 3, Sep. 2014, pp. 921-930.

Notice of Allowance from U.S. Appl. No. 14/702,861, dated Nov. 18, 2016.

Notice of Allowance from U.S. Appl. No. 14/984,086, dated Nov. 22, 2016.

* cited by examiner

| | DSS | VFO1 | SCO | VFO2 | ... | SCO | VFO1 | DSS |
|---|---|---|---|---|---|---|---|---|
| 1 | | | | | | | | |
| ⋮ | | | | | | | | |
| M | DSS | VFO1 | SCO | VFO2 | ... | SCO | VFO1 | DSS |

200 ↘    Data Set (VFO2 ... SCO VFO1)

FIG. 2A

| Forward Sync | CW1-4 Header | First CW1-4 | Resync | CW1-4 Header | Second CW1-4 | Reverse Sync |
|---|---|---|---|---|---|---|

| Forward Sync | First CWI-4 | Resync | Second CWI-4 | Reverse Sync |

| Byte positions | Length in bytes | Name of the field |
|---|---|---|
| 0 | 6 | CWI-4 Identifier |
| 6 | 4 | Write Pass |
| 10 | 2 | Header Parity |

FIG. 2D

DECODING DATA STORED WITH THREE ORTHOGONAL CODEWORDS

BACKGROUND

The present invention relates to data storage, and more particularly, to decoding data from multitrack linear magnetic tape that is encoded with three orthogonal codewords.

The smallest unit of appending or overwriting data onto linear magnetic tape is referred to as a Data Set. Data sets in tape storage are currently 3 MB-6 MB. Data sets consist of 32 to 64 Sub Data Sets (SDS) in current tape technology where each SDS consists of N2 rows, where N2 is equivalent to a C2 codeword length. An encoded SDS is formed from four column-interleaved product codewords (PCW).

In modern mass data storage systems, such as magnetic tape storage devices, data which is written on linear magnetic tape is protected by one or more error correction codes (ECCs). For data correction, data which is read from the tape is conceptually arranged into a large two dimensional array or matrix and is protected by two error correcting codes that are arranged orthogonal to one another, referred to typically as C1 code and C2 code. The large data array may be a SDS, include a portion of a SDS, or include more than a single SDS. The C1 code is used to correct the rows of the data array and the C2 code is used to correct the columns of the data array. Furthermore, data is divided into multiple byte-interleaved C1 codewords and dispersed across each row, referred to as a codeword interleave (CWI). This error correction methodology is very powerful.

However, there is a need for improving the protection of data sets to reduce online and offline error rates. When a data set is unable to be decoded, failure to decode only a single SDS in a data set is often observed as the issue which caused the data set to be unable to be decoded. Therefore, a small increase in redundancy might be able to avoid failures to decode a data set due to single SDS decoding failures, but no such improvement is currently available.

BRIEF SUMMARY

In one embodiment, a computer program product for reading data from a magnetic tape includes a computer readable storage medium having program instructions embodied therewith, the embodied program instructions executable by a processor of a linear tape drive to cause the processor to read, by the processor, packets of data from M parallel data tracks of the magnetic tape to obtain a plurality of (D+P)-symbol codewords which are logically arranged in nM encoded blocks, each packet including a row of an encoded block, wherein each encoded block includes an array having rows and columns of code symbols in which each column includes a codeword of a column code, where symbols of each of the (D+P)-symbol codewords are distributed over corresponding rows of the nM encoded blocks, and where n is an integer greater than zero, decode, by the processor, sub-blocks from rows and columns of a plurality of product codewords from the nM encoded blocks, each product codeword including a logical array of code symbols having the rows which include respective row codewords and the columns which include respective column codewords, wherein each sub-block includes a logical array having rows and columns of data symbols, combine, by the processor, the sub-blocks to form a block of data, and output, by the processor, the block of data.

In another embodiment, a linear tape drive includes a processor and logic integrated with and/or executable by the processor, the logic being configured to cause the processor to: read packets of data from M parallel data tracks of a magnetic tape to obtain a plurality of (D+P)-symbol codewords which are logically arranged in nM encoded blocks, each packet including a row of an encoded block, wherein each encoded block includes an array having rows and columns of code symbols in which each column includes a codeword of a column code, wherein symbols of each of the (D+P)-symbol codewords are distributed over corresponding rows of the nM encoded blocks, and wherein n is an integer greater than zero, decode sub-blocks from rows and columns of a plurality of product codewords from the nM encoded blocks, each product codeword including a logical array of code symbols having the rows which include respective row codewords and the columns which include respective column codewords, wherein each sub-block includes a logical array having rows and columns of data symbols, combine the sub-blocks to form a block of data, and output the block of data.

According to another embodiment, a method for reading data from a magnetic tape using a linear tape drive includes reading packets of data from M parallel data tracks of the magnetic tape to obtain a plurality of (D+P)-symbol codewords which are logically arranged in nM encoded blocks, each packet including a row of an encoded block, wherein each encoded block includes an array having rows and columns of code symbols in which each column includes a codeword of a column code, wherein symbols of each of the (D+P)-symbol codewords are distributed over corresponding rows of the nM encoded blocks, and wherein n is an integer greater than zero, decoding sub-blocks from rows and columns of a plurality of product codewords from the nM encoded blocks, each product codeword including a logical array of code symbols having the rows which include respective row codewords and the columns which include respective column codewords, wherein each sub-block includes a logical array having rows and columns of data symbols, combining the sub-blocks to form a block of data, and outputting the block of data.

Other aspects and embodiments of the present invention will become apparent from the following detailed description, which, when taken in conjunction with the drawings, illustrate by way of example the principles of the invention.

BRIEF DESCRIPTION OF THE SEVERAL VIEWS OF THE DRAWINGS

FIGS. 2A-2D show various headers associated with a four codeword interleave (CWI-4) data storage scheme.

DETAILED DESCRIPTION

Figure 1:
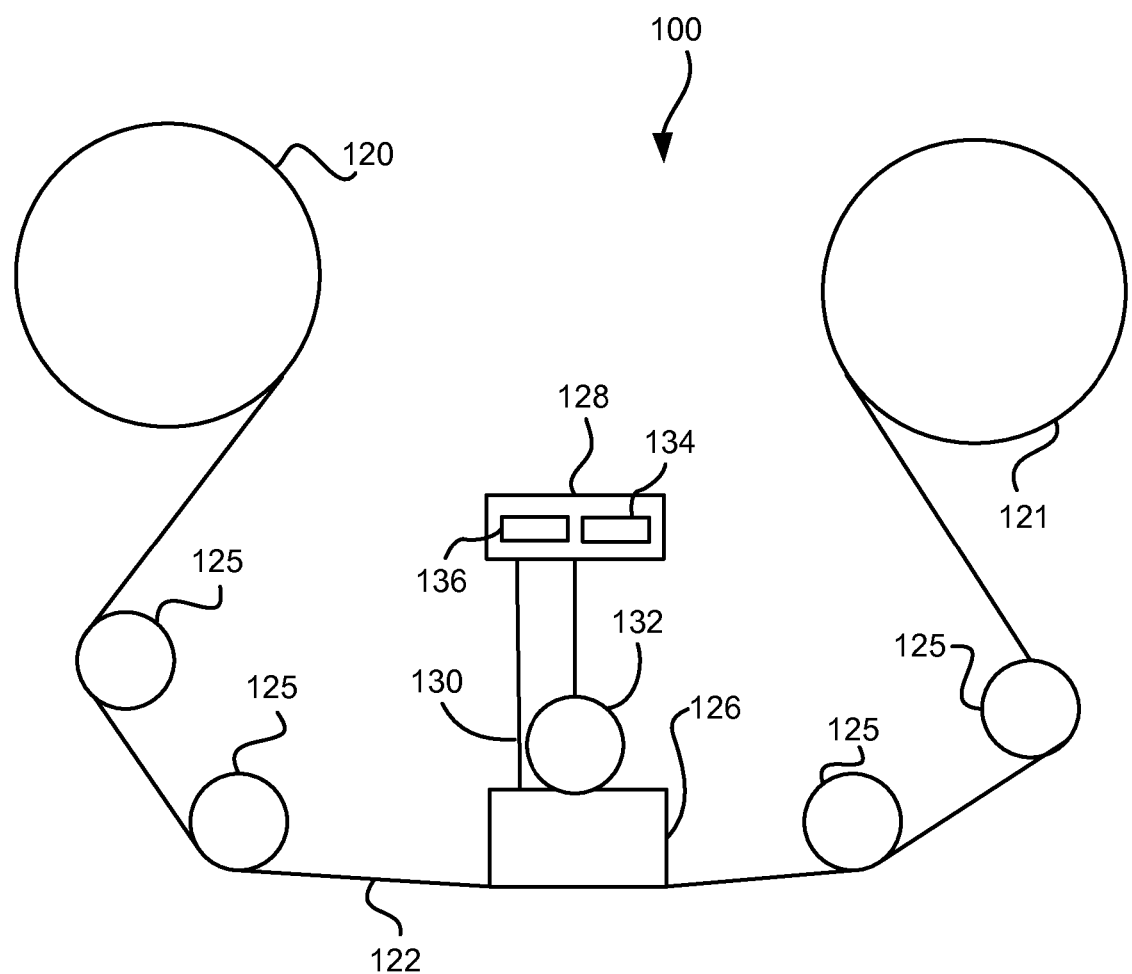
FIG. 1 illustrates a simplified tape drive of a tape-based data storage system, according to one embodiment.

The following description is made for the purpose of illustrating the general principles of the present invention and is not meant to limit the inventive concepts claimed herein. Further, particular features described herein can be used in combination with other described features in each of the various possible combinations and permutations.

Unless otherwise specifically defined herein, all terms are to be given their broadest possible interpretation including meanings implied from the specification as well as meanings understood by those skilled in the art and/or as defined in dictionaries, treatises, etc.

It must also be noted that, as used in the specification and the appended claims, the singular forms "a," "an," and "the" include plural referents unless otherwise specified. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

In one general embodiment, a computer program product for reading data from a magnetic tape includes a computer readable storage medium having program instructions embodied therewith, the embodied program instructions executable by a processor of a linear tape drive to cause the processor to read, by the processor, packets of data from M parallel data tracks of the magnetic tape to obtain a plurality of (D+P)-symbol codewords which are logically arranged in nM encoded blocks, each packet including a row of an encoded block, wherein each encoded block includes an array having rows and columns of code symbols in which each column includes a codeword of a column code, where symbols of each of the (D+P)-symbol codewords are distributed over corresponding rows of the nM encoded blocks, and where n is an integer greater than zero, decode, by the processor, sub-blocks from rows and columns of a plurality of product codewords from the nM encoded blocks, each product codeword including a logical array of code symbols having the rows which include respective row codewords and the columns which include respective column codewords, wherein each sub-block includes a logical array having rows and columns of data symbols, combine, by the processor, the sub-blocks to form a block of data, and output, by the processor, the block of data.

In another general embodiment, a linear tape drive includes a processor and logic integrated with and/or executable by the processor, the logic being configured to cause the processor to: read packets of data from M parallel data tracks of a magnetic tape to obtain a plurality of (D+P)-symbol codewords which are logically arranged in nM encoded blocks, each packet including a row of an encoded block, wherein each encoded block includes an array having rows and columns of code symbols in which each column includes a codeword of a column code, wherein symbols of each of the (D+P)-symbol codewords are distributed over corresponding rows of the nM encoded blocks, and wherein n is an integer greater than zero, decode sub-blocks from rows and columns of a plurality of product codewords from the nM encoded blocks, each product codeword including a logical array of code symbols having the rows which include respective row codewords and the columns which include respective column codewords, wherein each sub-block includes a logical array having rows and columns of data symbols, combine the sub-blocks to form a block of data, and output the block of data.

According to another general embodiment, a method for reading data from a magnetic tape using a linear tape drive includes reading packets of data from M parallel data tracks of the magnetic tape to obtain a plurality of (D+P)-symbol codewords which are logically arranged in nM encoded blocks, each packet including a row of an encoded block, wherein each encoded block includes an array having rows and columns of code symbols in which each column includes a codeword of a column code, wherein symbols of each of the (D+P)-symbol codewords are distributed over corresponding rows of the nM encoded blocks, and wherein n is an integer greater than zero, decoding sub-blocks from rows and columns of a plurality of product codewords from the nM encoded blocks, each product codeword including a logical array of code symbols having the rows which include respective row codewords and the columns which include respective column codewords, wherein each sub-block includes a logical array having rows and columns of data symbols, combining the sub-blocks to form a block of data, and outputting the block of data.

FIG. 1 illustrates a simplified tape drive 100 of a tape-based data storage system, which may be employed according to various embodiments. While one specific implementation of a tape drive is shown in FIG. 1, it should be noted that the embodiments described herein may be implemented in the context of any type of tape drive system.

As shown, a tape supply cartridge 120 and a take-up reel 121 are provided to support a tape 122. One or more of the reels may form part of a removable cassette and are not necessarily part of the tape drive 100. The tape drive 100, such as that illustrated in FIG. 1, may further include drive motor(s) to drive the tape supply cartridge 120 and the take-up reel 121 to move the tape 122 over a tape head 126 of any type.

Guides 125 guide the tape 122 across the tape head 126. Such tape head 126 is in turn coupled to a controller assembly 128 via a cable 130. The controller 128 typically comprises a servo channel 134 and data channel 136 which includes data flow processing. It controls reel motion (not shown in FIG. 1) and head functions, such as track following, writing, reading, etc. The cable 130 may include read/write circuits to transmit data to the head 126 to be recorded on the tape 122 and to receive data read by the head 126 from the tape 122. An actuator 132 moves the head 126 to a set of tracks on the tape 122 in order to perform a write or a read operation.

An interface may also be provided for communication between the tape drive 100 and a host (integral or external) to send and receive the data and for controlling the operation of the tape drive 100 and communicating the status of the tape drive 100 to the host, as would be understood by one of skill in the art.

Error Correction Code (ECC) is used in data storage to achieve very low bit error rates, e.g., magnetic tape storage products are designed to ensure bit error rates in the range of $1\times10^{-17}$ to $1\times10^{-19}$ under normal operating conditions.

Linear block codes, such as Reed-Solomon (RS) codes and low-density parity-check (LDPC) codes, have generally been preferred ECC schemes used in data storage products.

In FIG. 2A, a data set layout 200 having M concurrently written tracks is shown where a sequence of synchronized codeword objects (SCO) are written in each track. M also corresponds to the number of channels of a tape drive (e.g., for LTO-5 and LTO-6, M=16; for enterprise tape drives, M=32). Each data set starts with a data separating sequence field (DSS) and contains the various variable frequency oscillator fields (VFO1, VFO2) and SCO fields up to the next DSS field. FIG. 2B shows an SCO format 202 according to the prior art. In this layout, there are sixteen concurrently written tracks (M=16), and a CWI-4 header is twelve bytes, with each codeword in a CWI-4 being 240 bytes, with 4 codewords being 960 bytes total. FIG. 2C shows another SCO format 204 according to the prior art. In this layout, there are thirty-two concurrently written tracks (M=32) and the header is embedded in the CWI-4. Each codeword in a CWI-4 is 249 bytes, for a total for the four codewords in a CWI-4 of 996 bytes.

With reference to FIG. 2D, a 12-byte header 206 associated with a CWI-4 is shown in one embodiment. As shown, for bytes 0-11 (12 total bytes), the CWI-4 Identifier may be positioned at bytes 0-5 (6 bytes), the write pass at bytes 6-9 (4 bytes), and the header parity at bytes 10-11 (2 bytes). This is one embodiment of a layout for a CWI-4 header. Other possible byte distributions are also possible, as would be understood by one of skill in the art.

Any header which is included with a CWI-4 may be appended to a beginning, an end, or in some other way to its corresponding CWI-4, in various approaches. In alternate approaches, a header which is included with a CWI-4 may be embedded in the C1 codewords. Either of these approaches may be used in the context of the various embodiments described herein.

In one embodiment, a CWI-4 may include four interleaved C1 codewords, which represents a row of a sub data set. Furthermore, a CWI-4 set, written to a magnetic medium using a 16-channel magnetic head (capable of writing 16 tracks concurrently), may include 16 CWI-4s that are concurrently written on the magnetic medium, one CWI-4 for each of the tracks being written concurrently (which is the case for LTO-3, LTO-4, LTO-5, and LTO-6).

In another embodiment, a CWI-4 set written to a magnetic medium using a 32-channel magnetic head may include 32 CWI-4s that are concurrently written on the magnetic medium, one CWI-4 for each of the tracks being written concurrently (which is the case for enterprise tape drives).

For example, in one embodiment, a data set may include 384 CWI-4 sets. The data set is then written as 384 CWI-4 sets, each CWI-4 set including a fixed number, M, (8, 16, 32, 64, etc.) of CWI-4s written concurrently to M tracks of a magnetic medium.

In another embodiment, a data set may include 192 CWI-4 sets. The data set is then written as 192 CWI-4 sets, each CWI-4 set including a fixed number, M, (8, 16, 32, 64, etc.) of CWI-4s written concurrently to M tracks of a magnetic medium.

Of course, any number of CWI-4 sets may be included in a data set, and any number of tracks may have CWI-4s written concurrently thereto on the magnetic medium, in an approach that may be described as follows. P CWI-4 sets may be included in a data set, and M CWI-4s may be written concurrently through M channels to M tracks of a magnetic medium, where P>M, and where M and P each have a value that is modulo 8. Furthermore, modulo 8 may be any multiple of 8, such as 16, 32, 64, 192, 384, 768, etc. Additionally, P may be equal to two times N2, where N2 is the length (in symbols) of C2 codewords used in the encoding scheme. A symbol may be one or more bits in length, such as 1 byte.

In one embodiment, N2 may be an integer multiple (2, 3, 4, etc.) of a total number of concurrently written (or read) channels M. (e.g., M=16 for LTO-6 and M=32 in enterprise tape drives). Therefore, P may be, in some approaches, a multiple of M.

Figure 3:
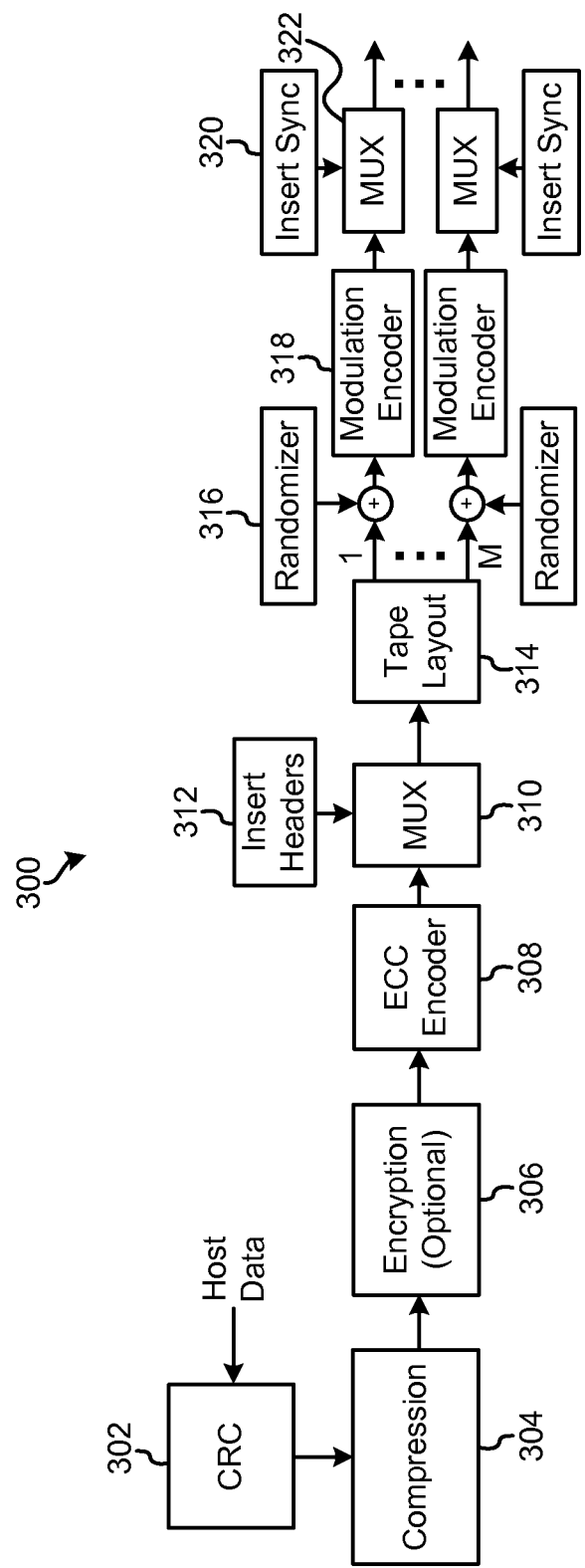
FIG. 3 shows a data flow according to one embodiment.

Now referring to FIG. 3, a data flow 300 for encoding host data in a tape drive with M simultaneously written tracks is shown according to one embodiment. As shown, the data flow 300 includes the operations of a cyclic redundancy check (CRC) encoder 302, a compression module 304, an optional encryption module 306, one or more error correction code (ECC) encoder modules 308, a multiplexer 310 for adding headers 312 to encoded data, tape layout addition module 314, randomizers 316 for data randomization in each tape channel 1 to M, modulation encoders 318 for each tape channel 1 to M, and multiplexers 322 for inserting synchronization patterns 320 for each tape channel 1 to M.

Typically, there are 32 channels in an enterprise tape drive, and therefore M=32, but any number of channels may be included in a tape drive. Other numbers of channels that are also possible include 8 channels, 16 channels, 64 channels, etc. A CWI-4 set comprises a fixed number, M, of concurrently written CWI-4s, the fixed number being equal to the number of channels in the writer.

There are typically five different types of overhead in data written to tape. These types of overhead include ECC, which is applied using one or more ECC encoders 308, modulation encoding which is applied using one or more modulation encoders 318, insertion of headers 312, insertion of synchronization patterns 320, and rewriting data following a read-while-write process to ensure the data integrity of the data first written. The format efficiency of a typical tape drive due to these sources of overhead, with the exception of rewriting, is about 79%, i.e., every 100 bits written onto tape are produced from only 79 bits of user data, and the added redundancy of overhead bits is 21 bits. User data in this context is the host data received at the input of the ECC encoder 308. Furthermore, about 3% of the tape storage space is reserved for rewriting data.

Figure 4:
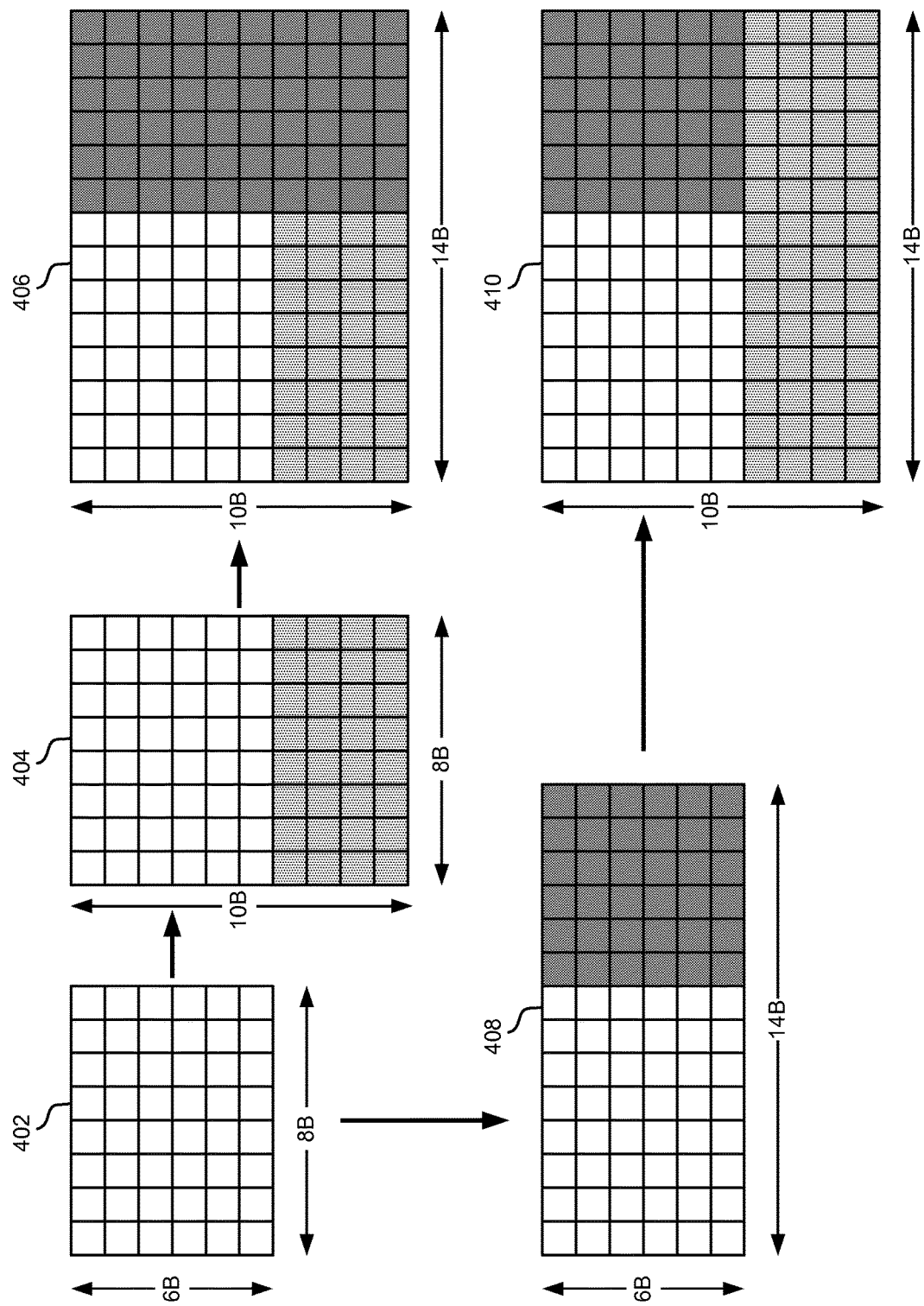
FIG. 4 shows simplified data encoding using a two-dimensional logical array.

ECC may be applied to data on a product codeword basis. As shown in FIG. 4, data may be arranged into a two-dimensional data array 402. Data array 402 is shown as being a 6×8 array, but any conceivable size of data array may be used, depending on storage constraints, processing power, error-rate performance requirements, and other tangible factors. However, for simplicity in this discussion, a 6×8 data array 402 is shown.

In a first embodiment, rows may be encoded first. For example, 6 bytes of parity may be added to each row, resulting in C1 codewords in each row of a 6×14 row-encoded array 408. Each C1 codeword is encoded using a [14,8,7] C1 code. Then, the columns may be encoded by adding 4 bytes of parity to each column, resulting in C2 codewords in each column (and C1 codewords in each row) of a 10×14 encoded array 410. Each C2 codeword is encoded using a [10,6,5] C2 code.

In a second embodiment, columns may be encoded first. For example, 4 bytes of parity may be added to each column, resulting in C2 codewords in each column of a 10×8 column-encoded array 404. Each C2 codeword is encoded using a [10,6,5] C2 code. Then, the rows may be encoded by adding 6 bytes of parity to each row, resulting in C1 codewords in each row (and C2 codewords in each column) of a 10×14 encoded array 406. Each C1 codeword is encoded using a [14,8,7] C1 code. Regardless of whether the rows are encoded first, or the columns are encoded first, the resulting 10×14 arrays 406, 410 are identical, and are considered to be [140,48,35] product codewords.

In a more realistic example, the C1 code may be a [240,230,11] RS code, the C2 code may be a [192,168,25] RS code, but regardless of the C1 and C2 codes used, every row in a product codeword is a C1 codeword, and every column in a product codeword is a C2 codeword. The distance of a product code is the product of the distances of its component C1 and C2 codes. Furthermore, before or after encoding, headers may be added to each row of the array to form headerized rows.

In a further embodiment, two or more product codewords may be combined into a larger two-dimensional array, referred to as a SDS. In one embodiment, four product codewords may be column-interleaved together to form a SDS, with all four first columns of the four product codewords being columns one to four of the SDS, all four second columns of the four product codewords being columns five to eight of the SDS, etc. The row of SDS is referred to as a codeword interleave (CWI), and since four C1 codewords are interleaved together, it is specifically referred to as a CWI-4. In this way, the four product codewords are interleaved into a SDS, with headers added. Then, each row of the SDS is written to magnetic tape as a packet of data using the plurality of M tape channels available to simultaneously write M packets that typically belong to M different SDS to the tape.

Each data set that is received by a tape drive for writing to a magnetic tape is processed prior to being written. The data set may be split into a plurality of SDSs, each SDS being organized into a two-dimensional data symbol array, such as that shown in FIG. 4. Each row in the 10×14 arrays 406, 410 comprises one or more C1 codewords, while each column in the 10×14 arrays 406, 410 comprises one or more C2 codewords. In linear tape open (LTO), each encoded-SDS includes two (for generations LTO 1-LTO 4) or four (LTO 5 and later) C1 codewords in the rows. However, anywhere from one to eight or more C1 codewords may be included in each row of the array. Usually, hundreds or even thousands of headers are assigned to a single data set because each data set includes multiple SDSs and each row of a column-encoded SDS is assigned a header (one header per row). Each header may include 12 bytes, or more or less, that are associated on a one-by-one basis with the rows of the column-encoded SDS.

When the C1 encoding takes place prior to the C2 encoding, as shown in row-encoded array 408, the C2 column parity extends along the entire length of each row of 408 in the C2 column parity portion of the 10×14 array 410. The C1 row parity is positioned at the end of each row outside of the C2 column parity area of the 10×14 array 410. However, the C1 codewords are still present even across the C2 column parity area. This is a property of the product code construction where the order of C1 and C2 extension may be interchanged without having an impact on the product codeword, i.e., all rows are from one code and all columns are from another code independent of the order of C1 and C2 extension. Therefore, the last columns of the C2 column parity area may be interpreted either as C1 parity or as C2 parity.

According to one embodiment, where each row includes four C1 codewords interleaved into the entirety of the row, referred to as a CWI-4, each C1 codeword may have 230 bytes of data, with the additional C1 parity adding an additional 10 bytes. Since four C1 codewords are interleaved in each row in this embodiment, each row (a row is one CWI-4) has 4×230 bytes+4×10 bytes=960 bytes. Furthermore, in this embodiment, there may be 96 rows in each SDS array, or more or less rows in other embodiments.

In addition, the headers, in one approach, may be 12 bytes long. This results in a total size of a SDS two-dimensional array being 93,312 bytes, with no ECC encoding for the headers.

Furthermore, in one approach, the C1 code may comprise a RS(240,230,11) code over the Galois field GF(256), and the C2 code may comprise a RS(96,84,13) code over GF(256).

In more approaches, the length of a CWI-4 (984 bytes, each codeword being 246 bytes) and header (12 bytes) may be 996 bytes. In another approach, the length of a CWI-4 and header combined may be 1000 bytes, 1004 bytes, or some other value suitable for encoding the CWI-4 and header information with a desired level of protection.

As data is stored to magnetic tape, a plurality of CWI-4s are dispersed across the tape channels, with each set of CWI-4s that are written concurrently to tape being referred to as a CWI-4 set. When the magnetic tape has 32 tracks, and the tape drive has 32 tape channels, a CWI-4 set includes 32 headerized CWI-4s, each from a different SDS. Also, when the C1 code is a [240,230,11] RS code and the C2 code is a [192,168,25] RS code, there will be 384 CWI-4 sets per data set. In this embodiment, a single CWI-4 from various different SDSs are written concurrently, thereby increasing data protection in case of read or write errors, such as skew errors, etc., that affect all data being written at a given time.

Furthermore, when data is determined to be improperly written during a read-while-write process, it will be rewritten to the rewrite section of the tape, located subsequent to the first write area on the tape.

After modulation encoding two headerized CWI-4s (2 packets), synchronized codeword objects (SCOs) are formed by inserting synchronization patterns between the packets and writing the SCOs onto the tracks of the tape. When the tape has 32 tracks, there are 32 SCOs in a SCO set. When writing is interrupted, any data set for which all the SCO sets have not been successfully recorded and subsequently verified after read-while-write processing is considered to be an interrupted data set. Therefore, the written granularity of a data set is a single SCO set. Each data set is separated when written to tape by a data set separator (DSS) sequence, and two different variable frequency oscillator (VFO) sequences are used to acquire timing, with VFO1 being 445 bits long, and VFO2 being 197 bits long. These synchronization patterns are also stored to tape. The longer VFO1 pattern is written before the first SCO set and after the last SCO set in a data set whereas the shorter VFO2 pattern is written between any two SCO sets in a data set.

Figure 5:
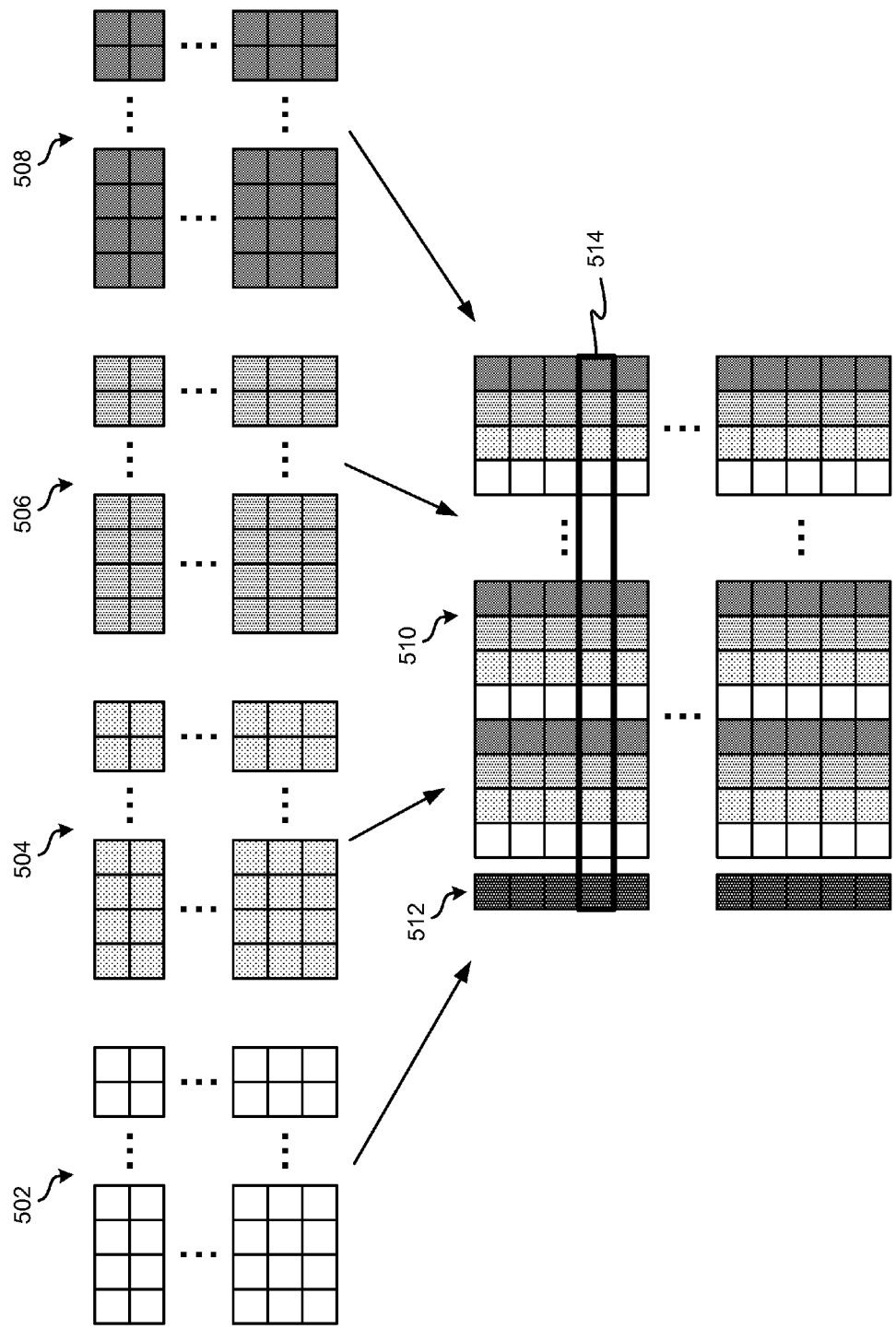
FIG. 5 shows a relationship between product codewords and a sub data set according to one embodiment.

Now referring to FIG. 5, the relationship between product codewords and a SDS is shown according to one embodiment. As shown, a SDS 510 comprises a plurality of headerized rows of encoded data interleaved together and arranged in a two-dimensional array. Each row of the SDS 510 includes a header 512 and symbols from each of a plurality of product codewords (PCWs) interleaved column by column. In the present example, four PCWs are included in the SDS 510: PCW 502, PCW 504, PCW 506, and PCW 508. However, any number of PCWs may be included in a SDS as would be apparent to one of skill in the art upon reading the present descriptions, such as 2, 6, 8, 10, 16, etc. Each PCW is shown as a two-dimensional array of encoded symbols, with the size of each PCW being determined based on any number of factors, such as available processing, past sizes used, backwards compatibility, convenience, etc.

In further approaches, the header 512 in each row of the SDS 510 may be of any length, such as 4 bytes, 6 bytes, 8 bytes, 12 bytes, 16 bytes, etc. Furthermore, the headers 512 may be encoded or un-encoded, depending on the amount of protection that is desired for the SDS 510. In other approaches, no headers 512 may be included for one or more of the rows of the SDS 510.

It is also noted that each row of the SDS 510, such as row 514, is a unit of data that may advantageously represent a packet used to store the SDS to magnetic tape. Therefore, when packets of data are read from the magnetic tape, each packet may represent a row of a SDS. Each packet, in one embodiment, has a size of about 1 kB: 4*240 B (size of rows of each PCW)+12 B (size of header). When a (192,168) C2 code is used for encoding the data, there are 192 packets per SDS 510, and for a 32-channel tape drive, 64 SDSs are included in each data set, which is about 12 MB in size.

In order to provide more robust error correction, a data set may be error and erasure decoded using three decoders in an iterative process using an algorithm that erases a data symbol of a codeword being decoded when orthogonal codewords intersecting at the particular data symbol previously failed to decode. In order for this method to be implemented, the data set is encoded such that a third-level parity is added to the encoded SDSs, i.e., the encoded data set on tape contains all-parity product codewords or SDSs (which include a predetermined number of product codewords). This allows improvement in the error rate performance without increasing the total ECC overhead, which will remain at about 16%.

In various embodiments, three orthogonal codewords, i.e., C1 codewords, C2 codewords, and orthogonal, right-angled (R) codewords in rectilinear space, may be used to encode data prior to writing the data to tracks of the linear magnetic tape.

Figure 6A:
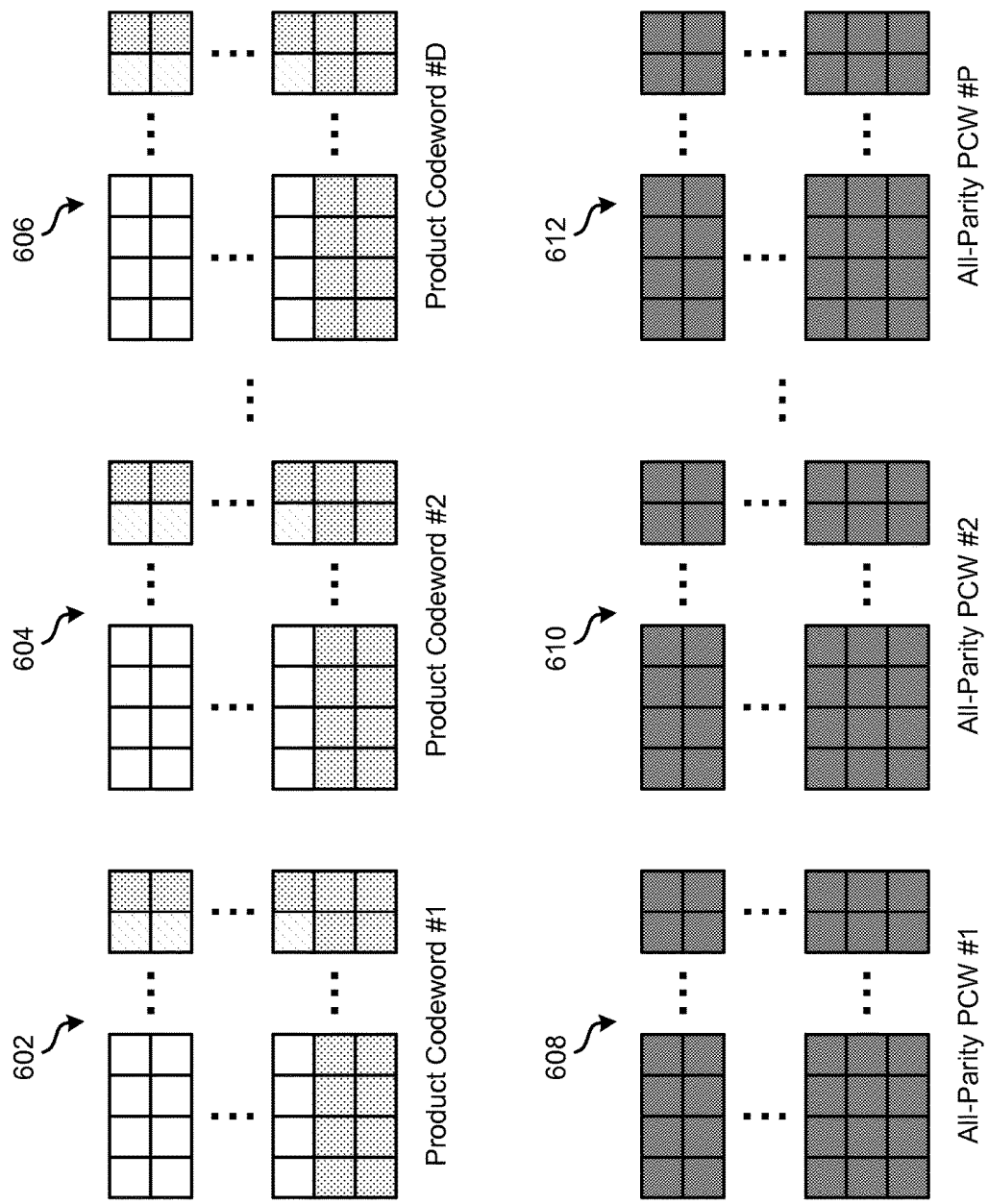
FIG. 6A shows product codeword-based encoding, according to one embodiment.

Now referring to FIG. 6A, an example of PCW-based data set encoding is shown according to one embodiment. As shown, the horizontal and vertical parity symbols (indicated by the shaded portions of each PCW) in PCW #1 602, PCW #2 604, . . . , PCW #D 606 are generated using a C1 row code and a C2 column code.

The parity symbols in all-parity PCW #1 608, all-parity PCW #2 610, . . . , all-parity PCW #P 612 are generated using a [D+P,D] linear code R that is applied orthogonal to the C1 and C2 codes. The R code is applied in a redundant fashion to the C1 and C2 codes, and may be referred to herein as an orthogonal code or a redundant code, in various descriptions.

In one embodiment, for tape storage, a preferred embodiment for C1, C2, and R codes are Reed-Solomon (RS) codes. Furthermore, for D+P=256 and P=1, the additional redundancy P/(D+P)=1/256 is only 0.39%. Therefore, it is possible to improve error-rate performance using PCW-based coding without increasing ECC overhead substantially, a desirable goal.

Figure 6B:
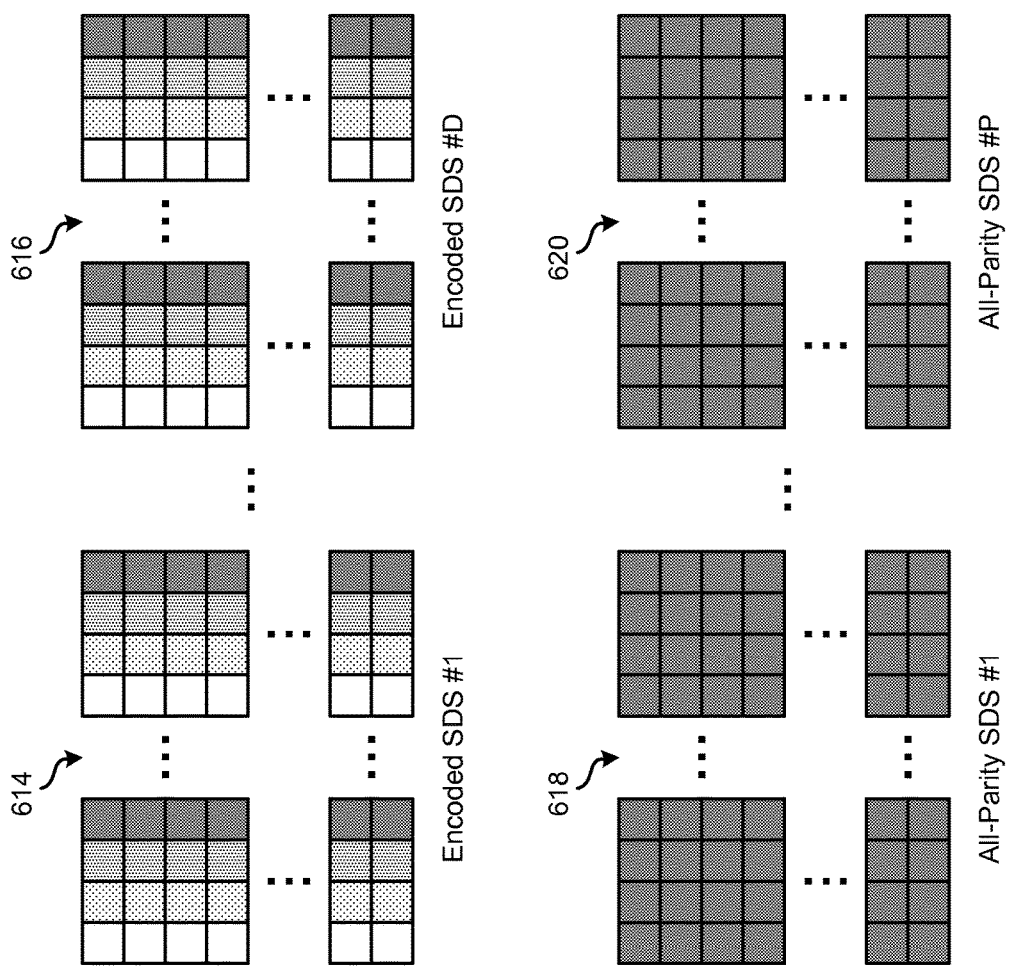
FIG. 6B shows sub data set-based encoding, according to one embodiment.

FIG. 6B shows an example of SDS-based data set encoding according to one embodiment. As shown, the horizontal and vertical parity symbols (not shown) in encoded SDS #1 614, . . . , encoded SDS #D 616 are generated using a C1 row code and a C2 column code.

The parity symbols in all-parity SDS #1 618, . . . , all-parity SDS #P 620 are generated using a [D+P,D] linear code R that is applied orthogonal to the C1 and C2 codes.

For D+P=64 and P=1, the additional redundancy P/(D+P)=1/64 is 1.56%, which is still an acceptable amount of increase in overhead for the amount of increased protection provided by the additional parity.

Figure 7:
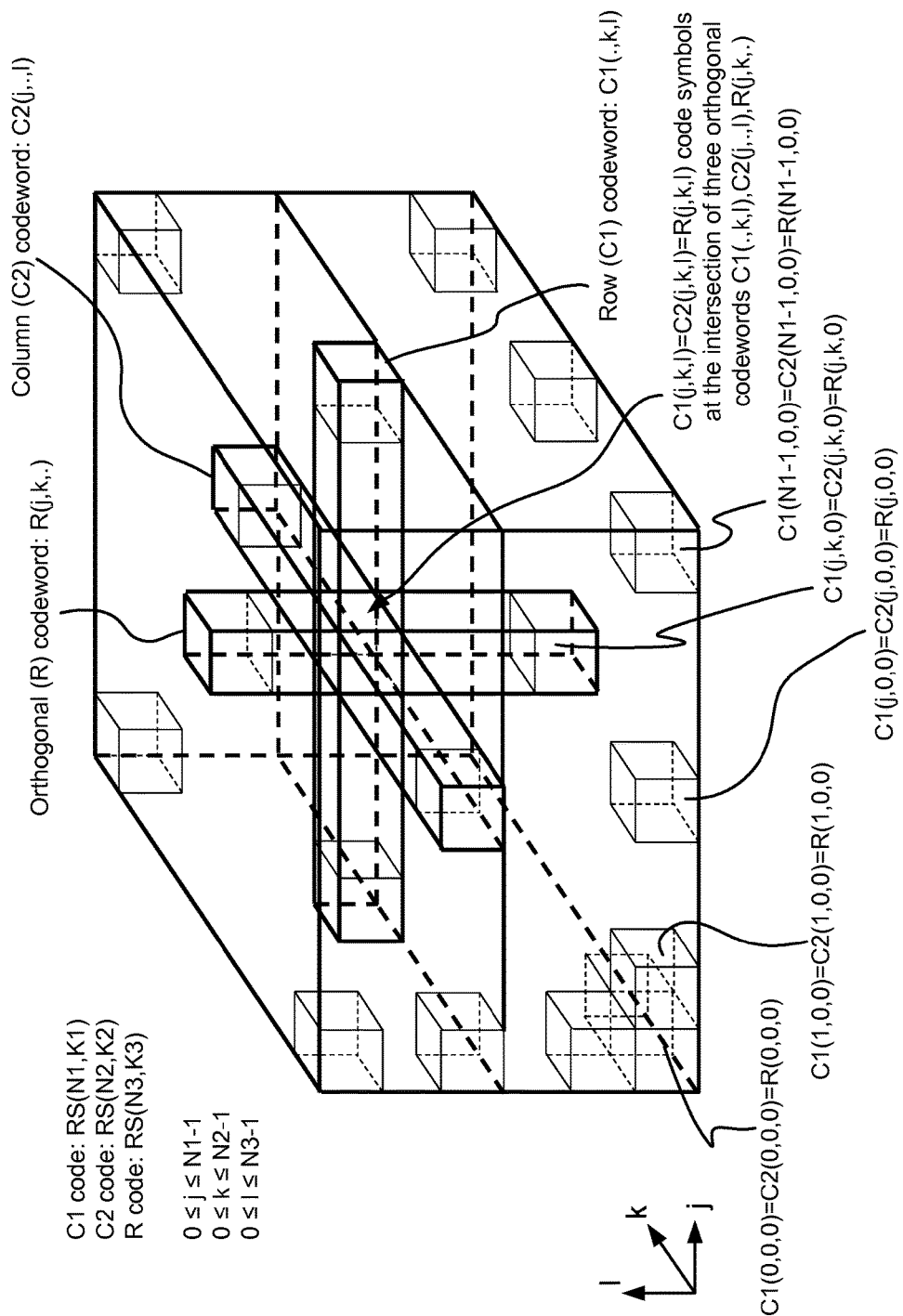
FIG. 7 shows a logical three-dimensional array for organizing encoded data, according to one embodiment.

With reference to FIG. 7, a rectangular cuboid is shown in which data may be arranged in a three-dimensional array. This three-dimensional array has a characteristic where each two-dimensional array of symbols taken from a single plane in the three-dimensional array, whether in the j×k, j×l, or the k×l plane, comprises a product codeword. The product codeword may be encoded using C1 and C2 codes, C1 and R codes, or C2 and R codes.

When PCW-based encoding is used to encode the data in the three-dimensional array, one three-dimensional array may be used to store a sub-block of data. When SDS-based encoding is used to encode the data in the three-dimensional array, four three-dimensional arrays may be included for each sub-block of data, as a SDS may have four PCWs therein, in one embodiment. Of course, more or less data may be stored in a single three-dimensional array depending on how a block of data is divided into sub-blocks, whether SDS- or PCW-based encoding is used, space constraints in storage devices, among other various factors.

Any one of the C1 codewords, at each code symbol thereof, shares the same (k,l) values, while changing the j value along the j axis. Also, any one of the C2 codewords, at each code symbol thereof, shares the same (j,l) values, while changing the k value along the k axis. Moreover, any one of the R codewords, at each code symbol thereof, shares the same (j,k) values, while changing the l value along the l axis. Although C1, C2, and R codewords are shown in the j, k, and l directions, respectively, any of the three codewords may be oriented to any of the three axes. The C1 code used is characterized as RS(N1,K1), the C2 code used is characterized as RS(N2,K2), and the R code used is characterized as RS(N3,K3), with any position in the three-dimensional array being constrained by the codes used such that $0 \leq j \leq N1-1$, $0 \leq k \leq N2-1$, and $0 \leq l \leq N3-1$, with the first symbol location being characterized as C1(0,0,0)=C2(0,0,0)=R(0,0,0).

After decoding this three-dimensional array, any of the code symbols determined based on a previous decoding may be either overwritten by a currently decoded symbol when decoding is successful, or they may be left unchanged or erased when decoding failed. Of course, during decoding, it is not known whether a decoded symbol is correct or not. These decoding errors may be due to the data not being recorded properly to the linear tape, the recorded data not being read correctly from the linear tape, some misalignment issue where the data is assumed to be from a different position than it actually belongs, or some other recording/reproducing error commonly known in the art. Therefore, whenever a symbol is referred to as being decoded, it is not necessarily true that the symbol is correctly recovered, and may still not accurately reflect what was intended to be recorded to the linear tape. These issues are accounted for in the three decoder systems and methods described herein in various embodiments.

The unique arrangement of symbols in this three-dimensional array allows for decoding of codewords to be performed in each of the j, k, and l directions, along with decoding of PCWs across entire planes of the three-dimensional array, e.g., j×k, j×l, and k×l. This is because any single code symbol in a codeword, e.g., C1(j,k,l), equals a code symbol determined from each of the other two codewords in the same position when decoded correctly, e.g., C1(j,k,l)=C2(j,k,l)=R(j,k,l). However, when decoding is unsuccessful using one decoding method (one of C1, C2, or R), e.g., the original data symbol is not recovered, one or more of the other two decoding methods (the unused of C1, C2, and R) may be relied upon to recover the original data symbol. This provides additional error correction capability without increasing the overhead associated with storing data to linear magnetic tape.

Figure 8A:
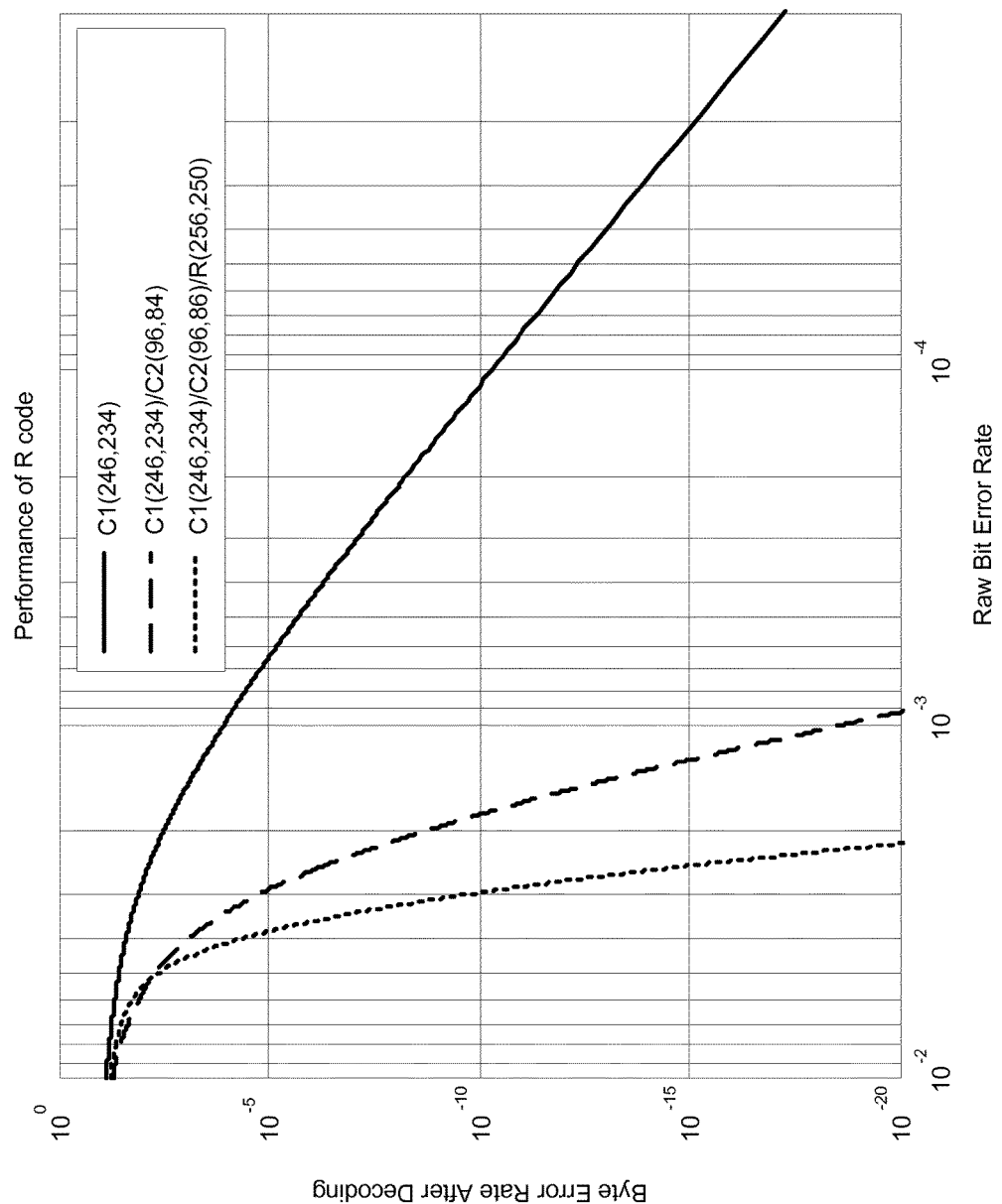
FIG. 8A shows performance of the R code based on the raw bit error rate, according to one embodiment.

FIG. 8A shows the performance of the R code, based on the raw bit error rate achievable when using only a C1 code of RS(246,234), a C1 and C2 code of RS(246,234) and RS(96,84), respectively, and a C1, C2, and R code of RS(246,234), RS(96,86), and RS(256,250), respectively. In this chart, the error rate performance is evaluated for independent bit errors at the input of the C1 decoder. The C1/C2 scheme and the C1/C2/R scheme have the same total ECC overhead, i.e., same format efficiency. The C1/C2/R scheme uses the same RS(246,234) C1 code and a slightly weaker RS(96,86) C2 code in order to be able to insert R overhead without increasing total ECC overhead.

As shown, the raw bit error rate is improved when using the C1, C2, and R codes to encode/decode the data, with a two time increase in robustness to raw channel bit errors without increasing overhead in any way.

Figure 8B:
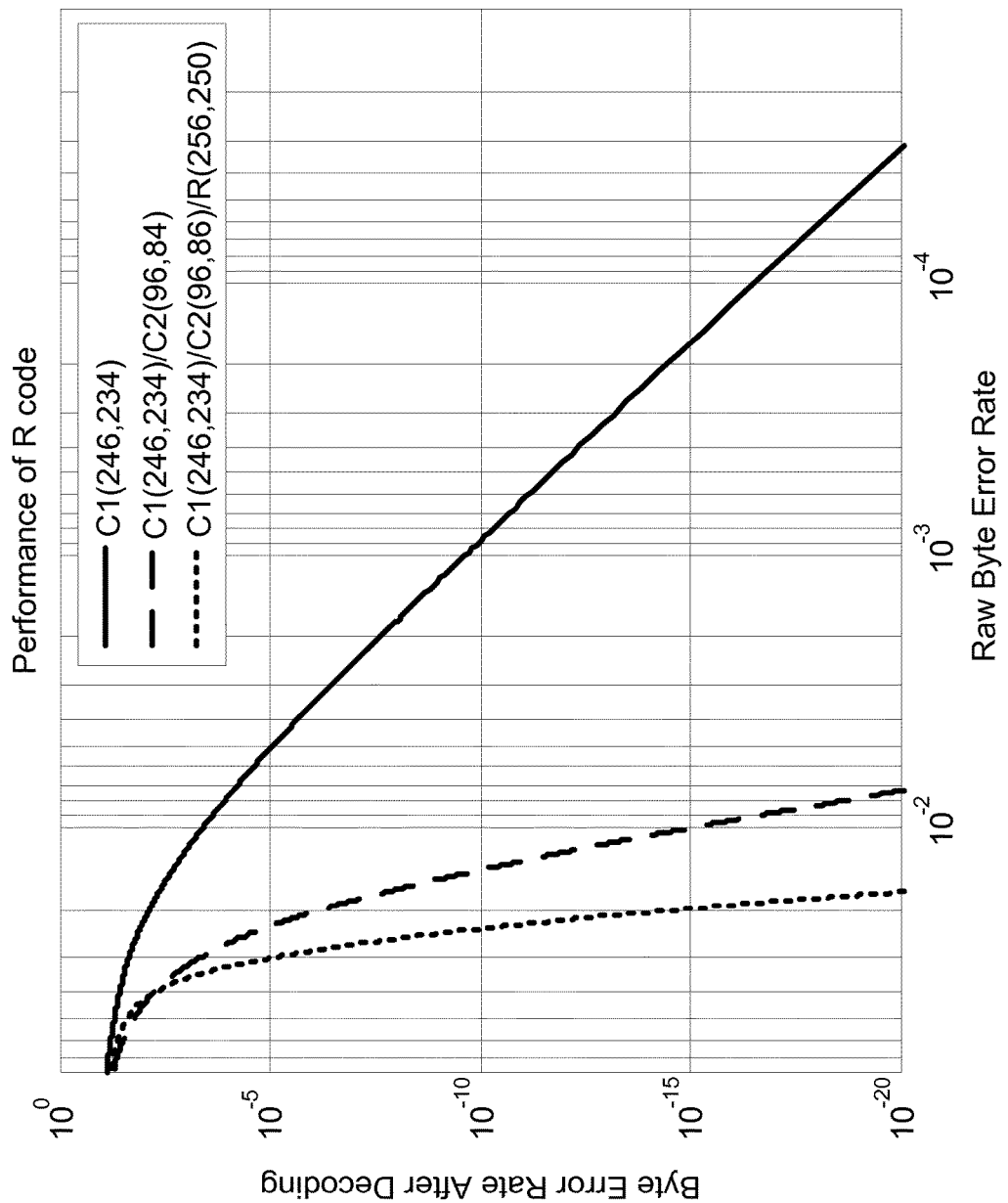
FIG. 8B shows performance of the R code based on the raw byte error rate, according to one embodiment.

FIG. 8B shows the performance of the R code, based on the raw byte error rate achievable when using only a C1 code of RS(246,234), a C1 and C2 code of RS(246,234) and RS(96,84), respectively, and a C1, C2, and R code of RS(246,234), RS(96,86), and RS(256,250), respectively. In this chart, the error rate performance is evaluated for independent byte errors at the input of the C1 decoder. The C1/C2 scheme and the C1/C2/R scheme have the same total ECC overhead, i.e., same format efficiency. The C1/C2/R scheme uses the same RS(246,234) C1 code and a slightly weaker RS(96,86) C2 code in order to be able to insert R overhead without increasing total ECC overhead.

As shown, the raw byte error rate is improved when using the C1, C2, and R codes to encode/decode the data, with a two time increase in robustness to raw channel byte errors without increasing overhead in any way.

Figure 9A:
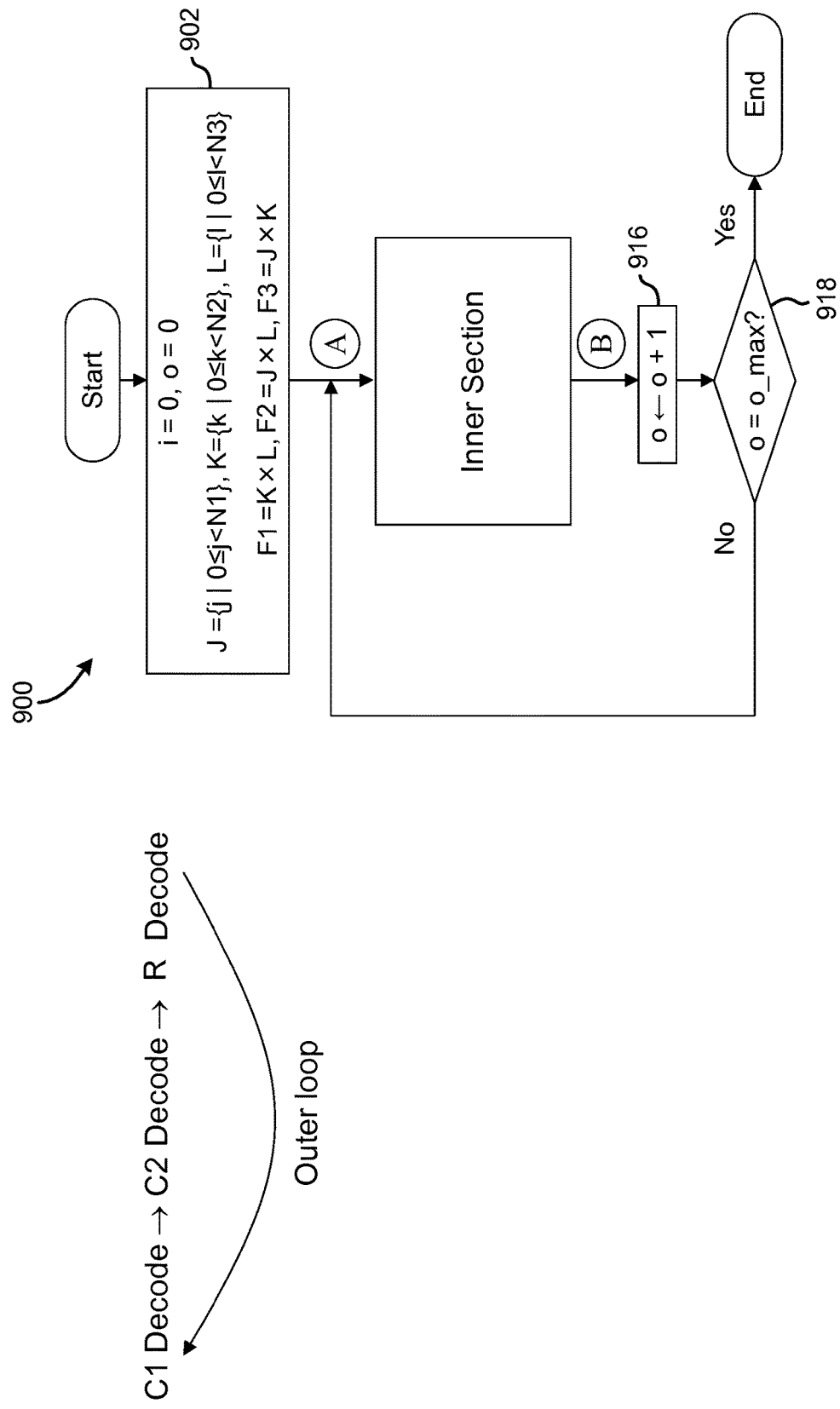
FIGS. 9A-9B show a decoding method, according to one embodiment.
Figure 9B:
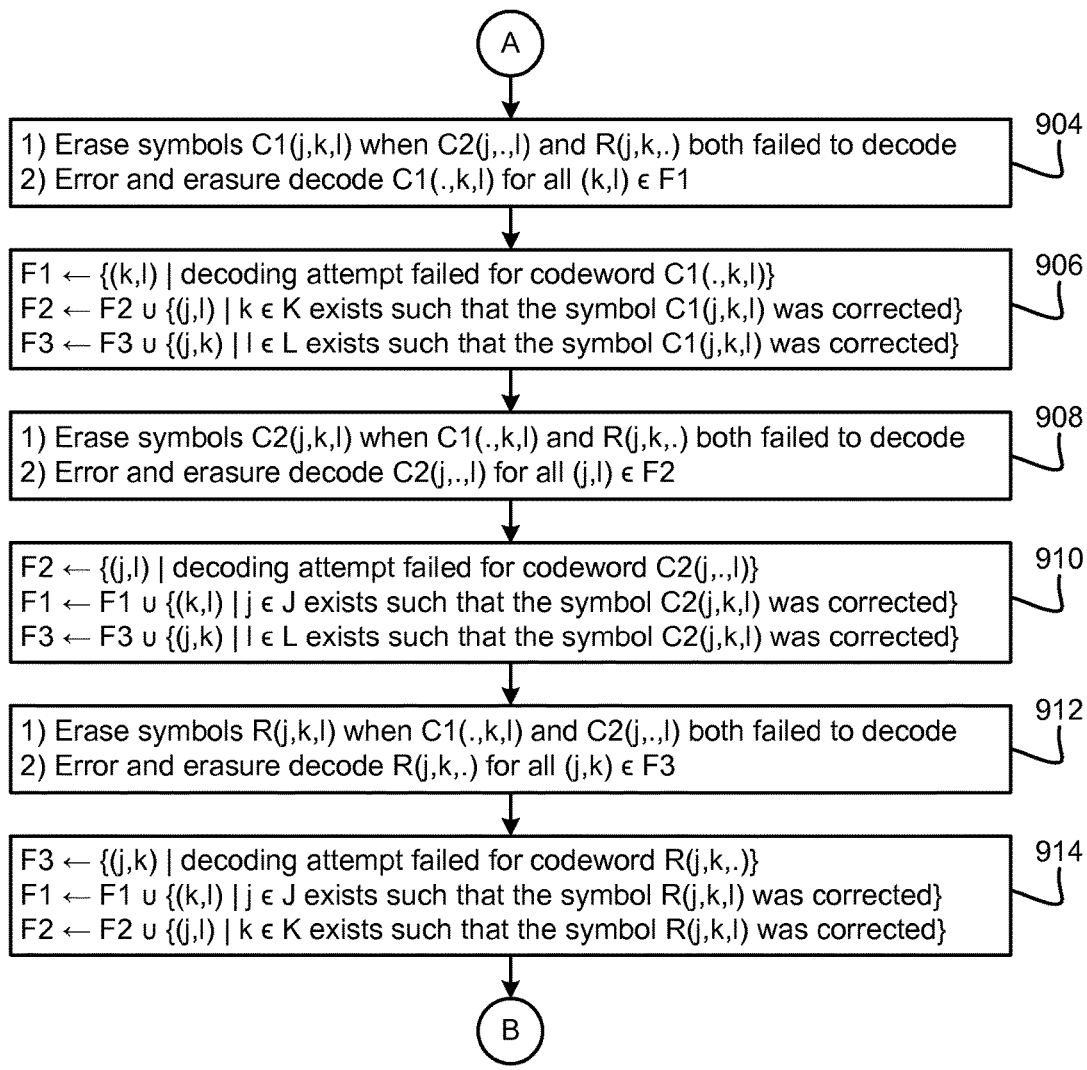

Now referring to FIGS. 9A-9B, a decoding method 900 is shown according to one embodiment. The method 900 may be executed in and/or with the use of any of the environments, systems, apparatuses, and/or schemes described in FIGS. 1-6B, in various approaches. Furthermore, the method 900 may include more or less operations than those specifically described with reference to FIGS. 9A-9B. For the description of method 900, during a first iteration of the method 900, C1(j,k,l) are code symbols at location (j,k,l) detected during C1 decoding, C2(j,k,l) when at the first iteration are code symbols at location (j,k,l) detected during C2 decoding, and R(j,k,l) when at the first iteration are code symbols at location (j,k,l) detected during R decoding. After the first iteration, the detected code symbols may be erased and/or overwritten during subsequent iterations of method 900.

Although decoding described in method 900 is shown proceeding in a specific order: 1) decode all C1 codewords, 2) decode all C2 codewords, 3) decode all R codewords, the order of decoding of the codewords may be in any conceivable order. C1, C2, and R codewords may be decoded in any order as long as all C1 codewords, all C2 codewords, and all R codewords are decoded at the end of each iteration.

In operation 902, an inner iteration counter (i) is set to zero (or may be excluded from method 900 as the inner iteration counter is not utilized further), an outer iteration counter (o) is set to zero, and the parameters for the decoding are set, such that J includes a set of numbers $\{j|0 \leq j \leq N1\}$, K includes a set of numbers $\{k|0 \leq k \leq N2\}$, and L includes a set of numbers $\{l|0 \leq l \leq N3\}$, where F1 is an array K×L, F2 is an array J×L, and F3 is an array J×K. After operation 902, method 900 continues to the inner section, which is described in FIG. 9B.

As shown in operation 904 of FIG. 9B, all symbols at locations (j,k,l) that are decoded using the C1 code are erased when corresponding symbols at locations (j,.,l) decoded using the C2 code and symbols at locations (j,k,.) decoded using the R code fail to decode, e.g., C2(j,.,l) and R(j,k,.) both fail to decode. Also, all symbols at locations (.,k,l) are error and erasure decoded using the C1 code for all symbols at locations (k,l) that are members of the set F1, e.g., error and erasure decode C1(.,k,l) for all (k,l) E F1.

In operation 906, F1 is expanded to include a set of symbols at locations (k,l) where a C1 codeword decoding attempt failed, e.g., F1←{(k,l)|decoding attempt failed for codeword C1(.,k,l)}. Also, F2 is expanded to include a set of symbols at locations (j,l) for each k in the set K where the symbol at location (j,k,l) was corrected during C1 decoding, e.g., F2←F2∪{(j,l)|k∈K exists such that the symbol C1(j,k,l) was corrected}. Moreover, F3 is expanded to include a set of symbols at locations (j,k) for each l in the set L where the symbol at location (j,k,l) was corrected during C1 decoding, e.g., F3←F3∪{(j,k)|l∈L exists such that the symbol C1(j,k,l) was corrected}.

In operation 908, all symbols at locations (j,k,l) that are decoded using the C2 code are erased when corresponding symbols at locations (.,k,l) decoded using the C1 code and symbols at locations (j,k,.) decoded using the R code fail to decode, e.g., C1(.,k,l) and R(j,k,.) both fail to decode. Also, all symbols at locations (j,.,l) are error and erasure decoded using the C2 code for all symbols at locations (j,l) that are members of the set F2, e.g., error and erasure decode C2(j,.,l) for all (j,l) E F2.

In operation 910, F2 is expanded to include a set of symbols at locations (j,l) where a C2 codeword decoding attempt failed, e.g., F2←{(j,l)|decoding attempt failed for codeword C2(j,.,l)}. Also, F1 is expanded to include a set of symbols at locations (k,l) for each j in the set J where the symbol at location (j,k,l) was corrected during C2 decoding, e.g., F1←F1∪{(k,l)|j∈J exists such that the symbol C2(j,k,l) was corrected}. Moreover, F3 is expanded to include a set of symbols at locations (j,k) for each l in the set L where the symbol at location (j,k,l) was corrected during C2 decoding, e.g., F3←F3∪{(j,k)|l∈L exists such that the symbol C2(j,k,l) was corrected}.

In operation 912, all symbols at locations (j,k,l) that are decoded using the R code are erased when corresponding symbols at locations (.,k,l) decoded using the C1 code and symbols at locations (j,.,l) decoded using the C2 code fail to decode, e.g., C1(.,k,l) and C2(j,.,l) both fail to decode. Also, all symbols at locations (j,k,.) are error and erasure decoded using the R code for all symbols at locations (j,k) that are members of the set F3, e.g., error and erasure decode R(j,k,.) for all (j,k)∈F3.

In operation 914, F3 is expanded to include a set of symbols at locations (j,k) where a R codeword decoding attempt failed, e.g., F3←{(j,k)|decoding attempt failed for codeword R(j,k,.)}. Also, F1 is expanded to include a set of symbols at locations (k,l) for each j in the set J where the symbol at location (j,k,l) was corrected during R decoding, e.g., F1←F1∪{(k,l)|j∈J exists such that the symbol R(j,k,l) was corrected}. Moreover, F2 is expanded to include a set of symbols at locations (j,l) for each k in the set K where the symbol at location (j,k,l) was corrected during R decoding, e.g., F2←F2∪{(j,l)|l∈K exists such that the symbol R(j,k,l) was corrected}.

After operation 914, method 900 returns to operation 916 as shown in FIG. 9A, where the outer iteration counter (o) is increased by one, e.g., o←o+1. Then, in operation 918, it is determined whether the outer iteration counter is equal to a maximum allowed number of outer iterations (o_max). The maximum allowed number of outer iterations may be determined based on processing capability, timing constraints on the length of the decoding operation, or any other conceivable factor that may lead to the decoding being limited to a certain number of iterations. In various embodiments, o_max may be set to 1, 2, 3, 5, 8, 10, etc.

When the outer iteration counter is equal to o_max, method 900 ends and the decoded data is output. When the outer iteration counter is not equal to o_max (e.g., it is less than o_max), method 900 returns to point A to repeat the inner section. Again, the number of iterations performed may depend on any conceivable factor, and may be set based on past experience in decoding data with certain parameters and various code types.

Figure 10A:
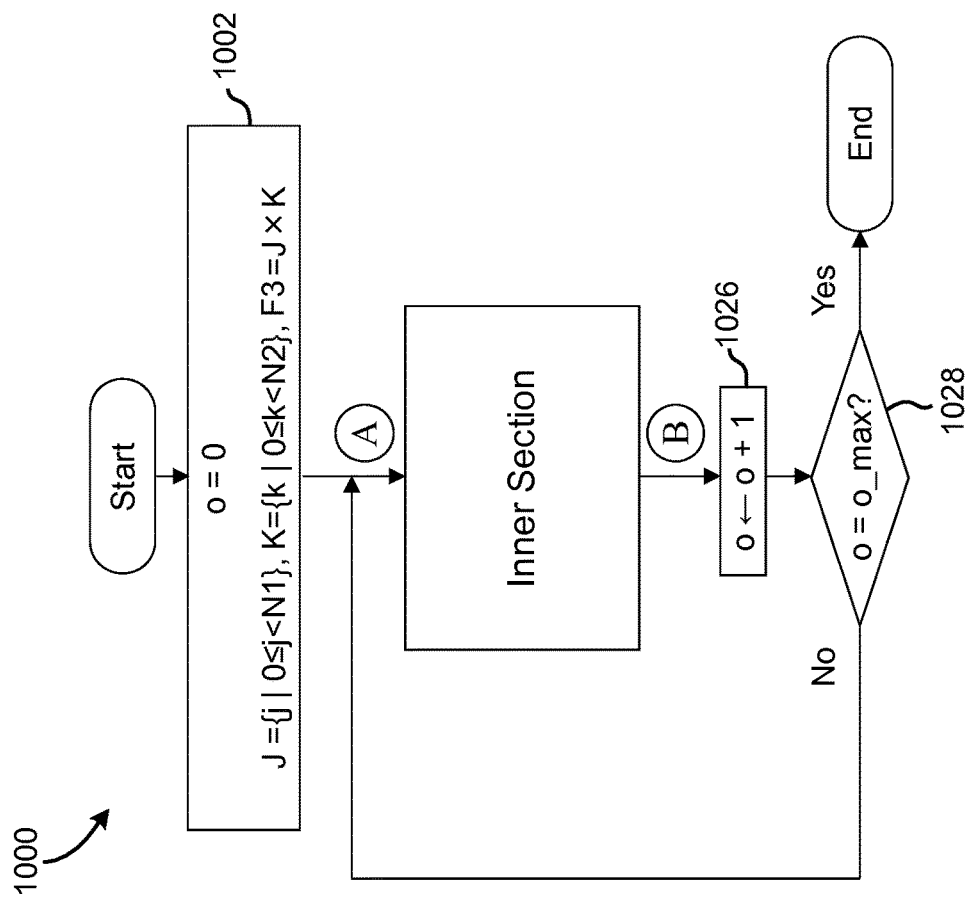
FIGS. 10A-10B show a decoding method, according to another embodiment.
Figure 10A:
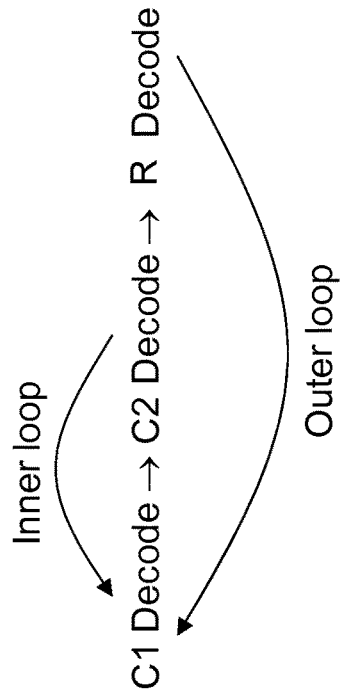
Figure 10B:
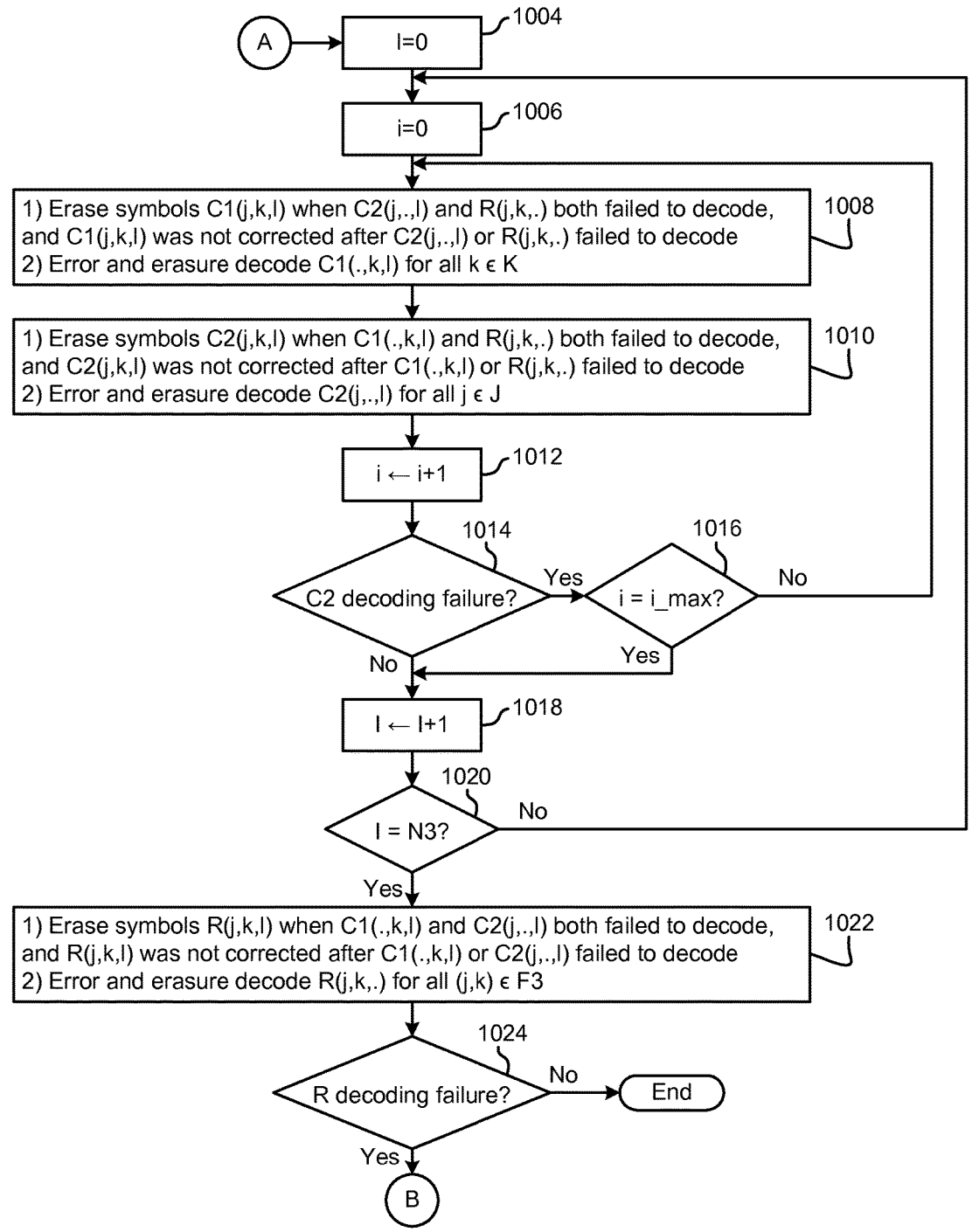

Now referring to FIGS. 10A-10B, a decoding method 1000 is shown according to one embodiment. The method 1000 may be executed in and/or with the use of any of the environments, systems, apparatuses, and/or schemes described in FIGS. 1-6B, in various approaches. Furthermore, the method 1000 may include more or less operations than those specifically described with reference to FIGS. 10A-10B.

For the description of method 1000, during a first iteration of the method 1000, C1(j,k,l) are code symbols at location (j,k,l) detected during C1 decoding, C2(j,k,l) when at the first iteration are code symbols at location (j,k,l) detected during C2 decoding, and R(j,k,l) when at the first iteration are code symbols at location (j,k,l) detected during R decoding. After the first iteration, the detected code symbols may be erased and/or overwritten during subsequent iterations of method 1000.

In method 1000 three decoders are used in an iterative manner. As shown, C1 and C2 decoding is repeated in an inner loop, followed by R decoding in an iterative fashion until valid codewords are produced, or a maximum number of inner or outer iterations are reached. Method 1000 generally erases a data symbol obtained in an attempt to decode a codeword in response to the other two orthogonal codewords intersecting at the data symbol being decoded previously failed to decode and the data symbol was not corrected after failure to decode the two orthogonal codewords.

In operation 1002, an outer iteration counter (o) is set to zero, and the parameters for the decoding are set, such that J includes a set of numbers {j|0≤j≤N1}, K includes a set of numbers {k|0≤k≤N2}, and F3 is an array J×K. After operation 1002, method 1000 continues to the inner section, which is described in FIG. 10B.

As shown in operation 1004 of FIG. 10B, l is set to zero, l corresponding to a particular plane within the three-dimensional array that is being decoded.

In operation 1006, the inner iteration counter (i) is set to zero, e.g., i=0.

In operation 1008, all symbols at locations (j,k,l) that are decoded using the C1 code are erased when corresponding symbols at locations (j,.,l) decoded using the C2 code and symbols at locations (j,k,.) decoded using the R code fail to decode, e.g., C2(j,.,l) and R(j,k,.) both fail to decode, and the symbol at location (j,k,l) was not corrected after C2 decoding or R decoding failed to decode, e.g., C2(j,.,l) or R(j,k,.) failed to decode. Also, all symbols at locations (.,k,l) are error and erasure decoded using the C1 code for all k within the set K, e.g., error and erasure decode C1(.,k,l) for all k∈K.

In operation 1010, all symbols at locations (j,k,l) that are decoded using the C2 code are erased when corresponding symbols at locations (.,k,l) decoded using the C1 code and symbols at locations (j,k,.) decoded using the R code fail to decode, e.g., C1(.,k,l) and R(j,k,.) both fail to decode, and the symbol at location (j,k,l) was not corrected after C1 decoding or R decoding failed to decode, e.g., C1(.,k,l) or R(j,k,.) failed to decode. Also, all symbols at locations (j,.,l) are error and erasure decoded using the C2 code for all j within the set J, e.g., error and erasure decode C2(j,.,l) for all j∈J.

In operation 1012, the inner iteration counter is increased by one, e.g., i←i+1.

In operation 1014, it is determined whether C2 decoding failed for any symbol (j,.,l). When C2 decoding failed for any symbol (j,.,l), method 1000 proceeds to operation 1016. When C2 decoding has not failed for all symbols (j,.,l), method 1000 proceeds to operation 1018 where l is increased by one, e.g., l←l+1.

In operation 1016, it is determined whether the inner iteration counter is equal to a maximum allowed number of inner iterations (i_max). The maximum allowed number of inner iterations may be determined based on processing capability, timing constraints on the length of the decoding operation, or any other conceivable factor that may lead to the decoding being limited to a certain number of iterations. In various embodiments, i_max may be set to 1, 2, 3, 5, 8, 10, etc.

When the inner iteration counter is equal to i_max, method 1000 continues to operation 1018 where l is increased by one, e.g., l←l+1. When the inner iteration counter is not equal to i_max (e.g., it is less than i_max), method 1000 returns to repeat operations 1008 and 1010. Again, the number of iterations performed may depend on any conceivable factor, and may be set based on past experience in decoding data with certain parameters and various code types.

In operation 1020, it is determined whether l is equal to N3, the number of symbols in the l direction of the three-dimensional array. When l is equal to N3, method 1000 continues to operation 1022; otherwise, method 1000 returns to operation 1006 to reset the inner iteration counter to zero.

In operation 1022, all symbols at locations (j,k,l) that are decoded using the R code are erased when corresponding symbols at locations (.,k,l) decoded using the C1 code and symbols at locations (j,.,l) decoded using the C2 code fail to decode, e.g., C1(.,k,l) and C2(j,.,l) both fail to decode, and the symbol at location (j,k,l) was not corrected after C1 decoding or C2 decoding failed to decode, e.g., C1(.,k,l) or C2(j,.,l) failed to decode. Also, all symbols at locations (j,k,.) are error and erasure decoded using the R code for all (j,k) within the set F3, e.g., error and erasure decode R(j,k,.) for all (j,k)∈F3.

In operation 1024, it is determined whether R decoding failed for any symbol (j,k,.). When no R decoding failure is detected, method 1000 ends and the decoded data is output. When R decoding failed for any symbol (j,k,.), method 1000 proceeds to point B pointing to operation 1026 in FIG. 10A.

In operation 1026, the outer iteration counter is increased by one, e.g., o←o+1. Then, in operation 1028, it is determined whether the outer iteration counter is equal to a maximum allowed number of outer iterations (o_max). The maximum allowed number of outer iterations may be determined based on processing capability, timing constraints on the length of the decoding operation, or any other conceivable factor that may lead to the decoding being limited to a certain number of iterations. In various embodiments, o_max may be set to 1, 2, 3, 5, 8, 10, etc.

When the outer iteration counter is equal to o_max, method 1000 ends and the decoded data is output. When the outer iteration counter is not equal to o_max (e.g., it is less than o_max), method 1000 returns to point A to repeat the inner section. Again, the number of iterations performed may depend on any conceivable factor, and may be set based on past experience in decoding data with certain parameters and various code types.

Figure 11A:
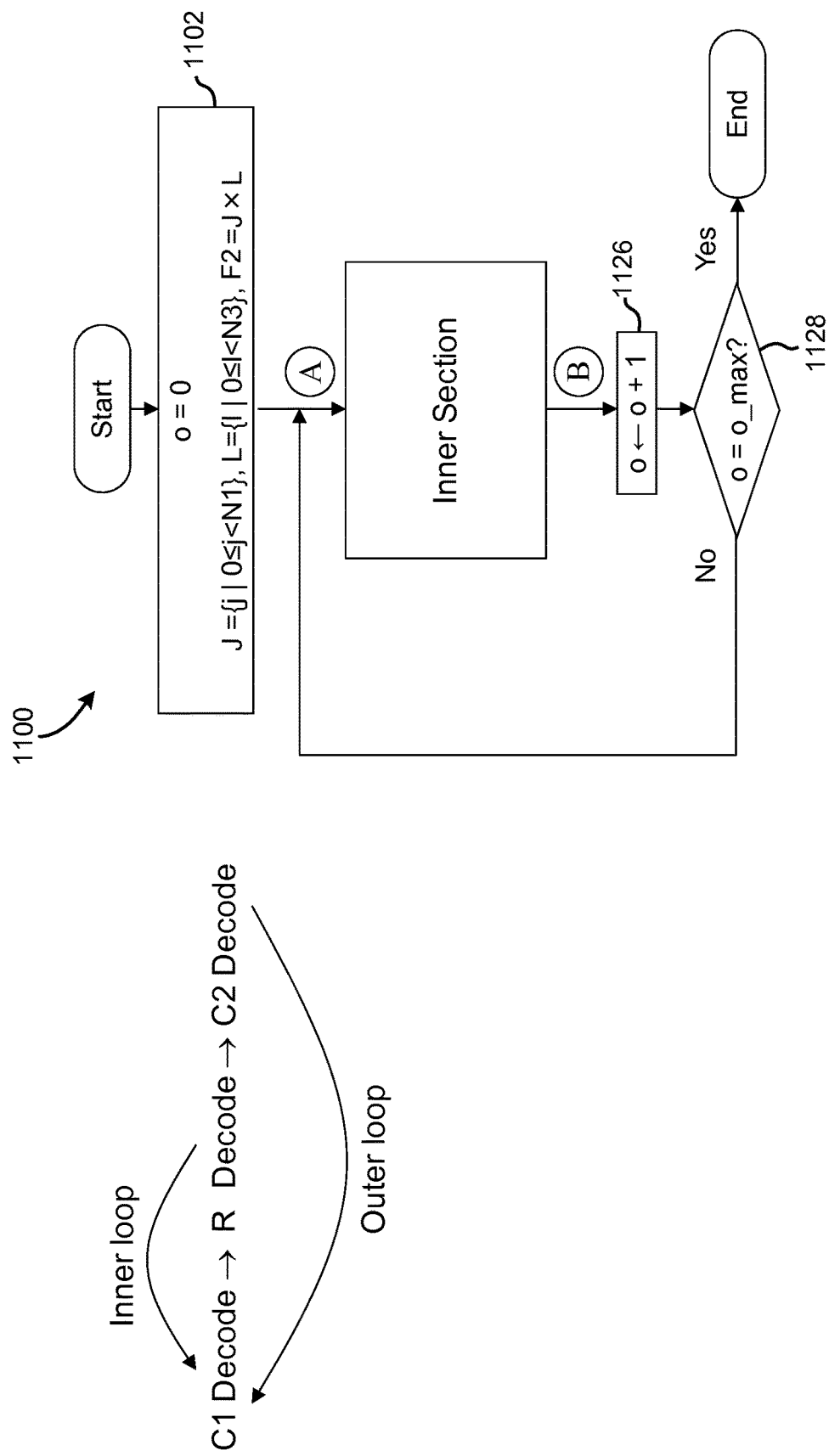
FIGS. 11A-11B show a decoding method, according to yet another embodiment.
Figure 11B:
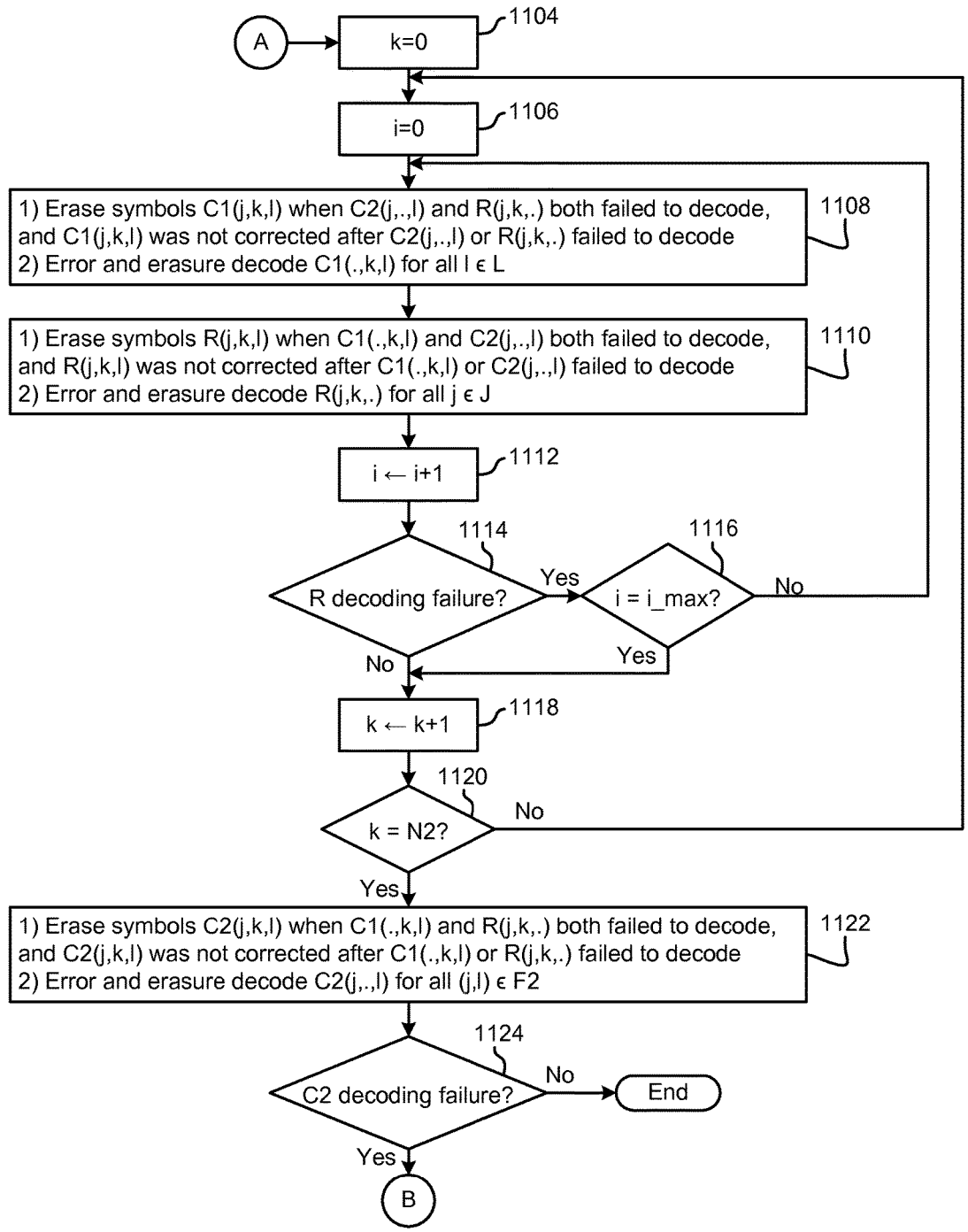

Now referring to FIGS. 11A-11B, a decoding method 1100 is shown according to one embodiment. The method 1100 may be executed in and/or with the use of any of the environments, systems, apparatuses, and/or schemes described in FIGS. 1-6B, in various approaches. Furthermore, the method 1100 may include more or less operations than those specifically described with reference to FIGS. 11A-11B.

For the description of method 1100, during a first iteration of the method 1100, C1(j,k,l) are code symbols at location (j,k,l) detected during C1 decoding, C2(j,k,l) when at the first iteration are code symbols at location (j,k,l) detected during C2 decoding, and R(j,k,l) when at the first iteration are code symbols at location (j,k,l) detected during R decoding. After the first iteration, the detected code symbols may be erased and/or overwritten during subsequent iterations of method 1100.

In method 1100 three decoders are used in an iterative manner. As shown, C1 and R decoding is repeated in an inner loop, followed by C2 decoding in an iterative fashion until valid codewords are produced, or a maximum number of inner or outer iterations are reached. Method 1100 generally erases a data symbol obtained in an attempt to decode a codeword in response to the other two orthogonal codewords intersecting at the data symbol being decoded previously failed to decode and the data symbol was not corrected after failure to decode the two orthogonal codewords.

In operation 1102, an outer iteration counter (o) is set to zero, and the parameters for the decoding are set, such that J includes a set of numbers {j|0≤j≤N1}, L includes a set of numbers {l|0≤l≤N3}, and F2 is an array J×L. After operation 1102, method 1100 continues to the inner section, which is described in FIG. 11B.

As shown in operation 1104 of FIG. 11B, k is set to zero, k corresponding to a particular plane within the three-dimensional array that is being decoded.

In operation 1106, the inner iteration counter (i) is set to zero, e.g., i=0.

In operation 1108, all symbols at locations (j,k,l) that are decoded using the C1 code are erased when corresponding symbols at locations (j,.,l) decoded using the C2 code and symbols at locations (j,k,.) decoded using the R code fail to decode, e.g., C2(j,.,l) and R(j,k,.) both fail to decode, and the symbol at location (j,k,l) was not corrected after C2 decoding or R decoding failed to decode, e.g., C2(j,.,l) or R(j,k,.) failed to decode. Also, all symbols at locations (.,k,l) are error and erasure decoded using the C1 code for all l within the set L, e.g., error and erasure decode C1(.,k,l) for all l∈L.

In operation 1110, all symbols at locations (j,k,l) that are decoded using the R code are erased when corresponding symbols at locations (.,k,l) decoded using the C1 code and symbols at locations (j,.,l) decoded using the C2 code fail to decode, e.g., C1(.,k,l) and C2(j,.,l) both fail to decode, and the symbol at location (j,k,l) was not corrected after C1 decoding or C2 decoding failed to decode, e.g., C1(.,k,l) or C2(j,.,l) failed to decode. Also, all symbols at locations (j,k,.) are error and erasure decoded using the R code for all j within the set J, e.g., error and erasure decode R(j,k,.) for all j∈J.

In operation 1112, the inner iteration counter is increased by one, e.g., i←i+1.

In operation 1114, it is determined whether R decoding failed for any symbol (j,k,.). When R decoding failed for any symbol (j,k,.), method 1100 proceeds to operation 1116. When R decoding has not failed for all symbols (j,k,.), method 1100 proceeds to operation 1118 where k is increased by one, e.g., k←k+1.

In operation 1116, it is determined whether the inner iteration counter is equal to a maximum allowed number of inner iterations (i_max). The maximum allowed number of inner iterations may be determined based on processing capability, timing constraints on the length of the decoding operation, or any other conceivable factor that may lead to the decoding being limited to a certain number of iterations. In various embodiments, i_max may be set to 1, 2, 3, 5, 8, 11, etc.

When the inner iteration counter is equal to i_max, method 1100 continues to operation 1118 where k is increased by one, e.g., k←k+1. When the inner iteration counter is not equal to i_max (e.g., it is less than i_max), method 1100 returns to repeat operations 1108 and 1110. Again, the number of iterations performed may depend on any conceivable factor, and may be set based on past experience in decoding data with certain parameters and various code types.

In operation 1120, it is determined whether k is equal to N2, the number of symbols in the k direction of the three-dimensional array. When k is equal to N2, method 1100 continues to operation 1122; otherwise, method 1100 returns to operation 1106 to reset the inner iteration counter to zero.

In operation 1122, all symbols at locations (j,k,l) that are decoded using the C2 code are erased when corresponding symbols at locations (.,k,l) decoded using the C1 code and symbols at locations (j,k,.) decoded using the R code fail to decode, e.g., C1(.,k,l) and R(j,k,.) both fail to decode, and the symbol at location (j,k,l) was not corrected after C1 decoding or R decoding failed to decode, e.g., C1(.,k,l) or R(j,k,.) failed to decode. Also, all symbols at locations (j,.,l) are error and erasure decoded using the C2 code for all (j,l) within the set F2, e.g., error and erasure decode C2(j,.,l) for all (j,l) ∈ F2.

In operation 1124, it is determined whether C2 decoding failed for any symbol (j,.,l). When no C2 decoding failure is detected, method 1100 ends and the decoded data is output. When C2 decoding failed for any symbol (j,.,l), method 1100 proceeds to point B pointing to operation 1126 in FIG. 11A.

In operation 1126, the outer iteration counter is increased by one, e.g., o←o+1. Then, in operation 1128, it is determined whether the outer iteration counter is equal to a maximum allowed number of outer iterations (o_max). The maximum allowed number of outer iterations may be determined based on processing capability, timing constraints on the length of the decoding operation, or any other conceivable factor that may lead to the decoding being limited to a certain number of iterations. In various embodiments, o_max may be set to 1, 2, 3, 5, 8, 11, etc.

When the outer iteration counter is equal to o_max, method 1100 ends and the decoded data is output. When the outer iteration counter is not equal to o_max (e.g., it is less than o_max), method 1100 returns to point A to repeat the inner section. Again, the number of iterations performed may depend on any conceivable factor, and may be set based on past experience in decoding data with certain parameters and various code types.

Figure 12A:
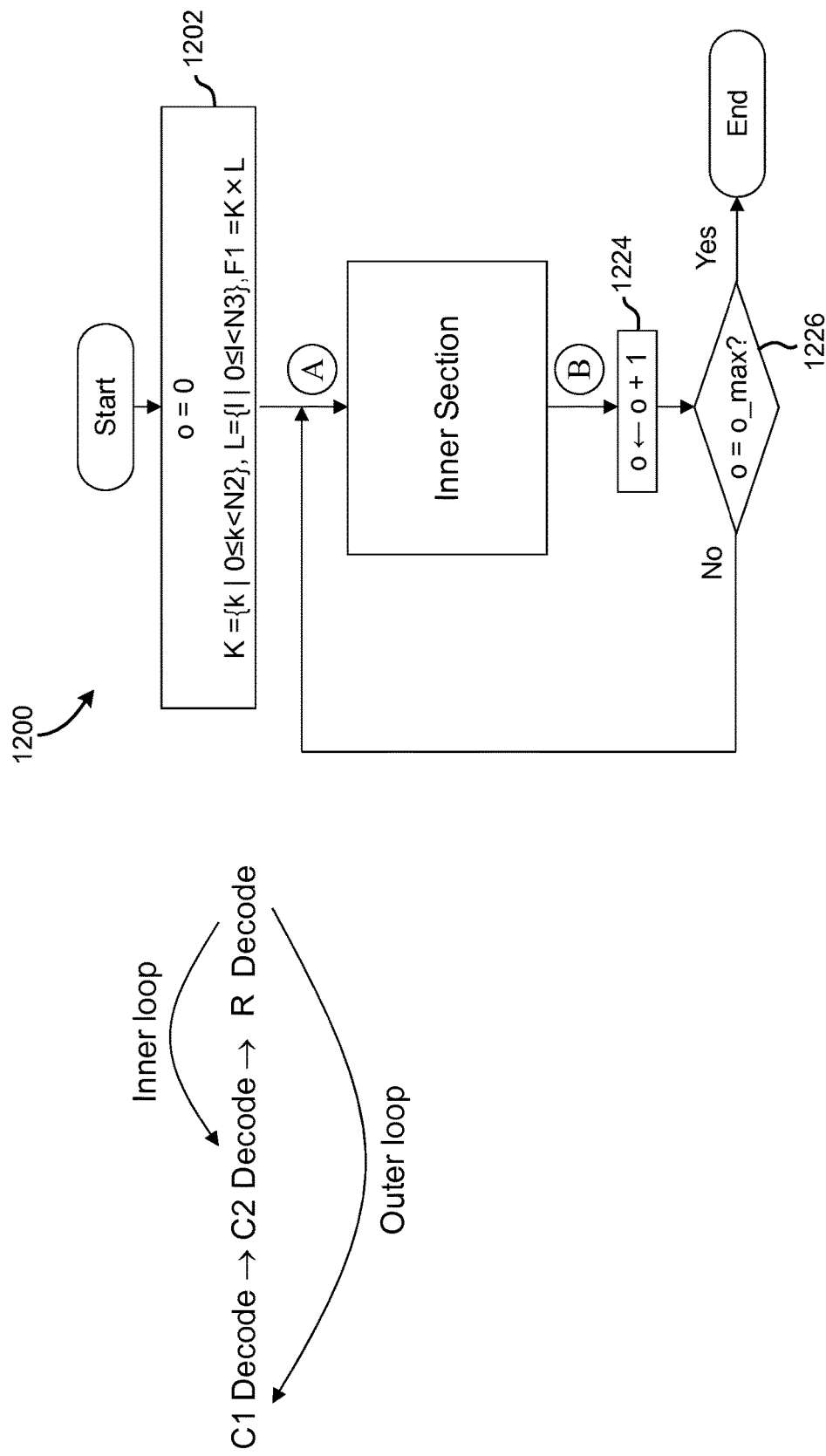
FIGS. 12A-12B show a decoding method, in accordance with another embodiment.
Figure 12B:
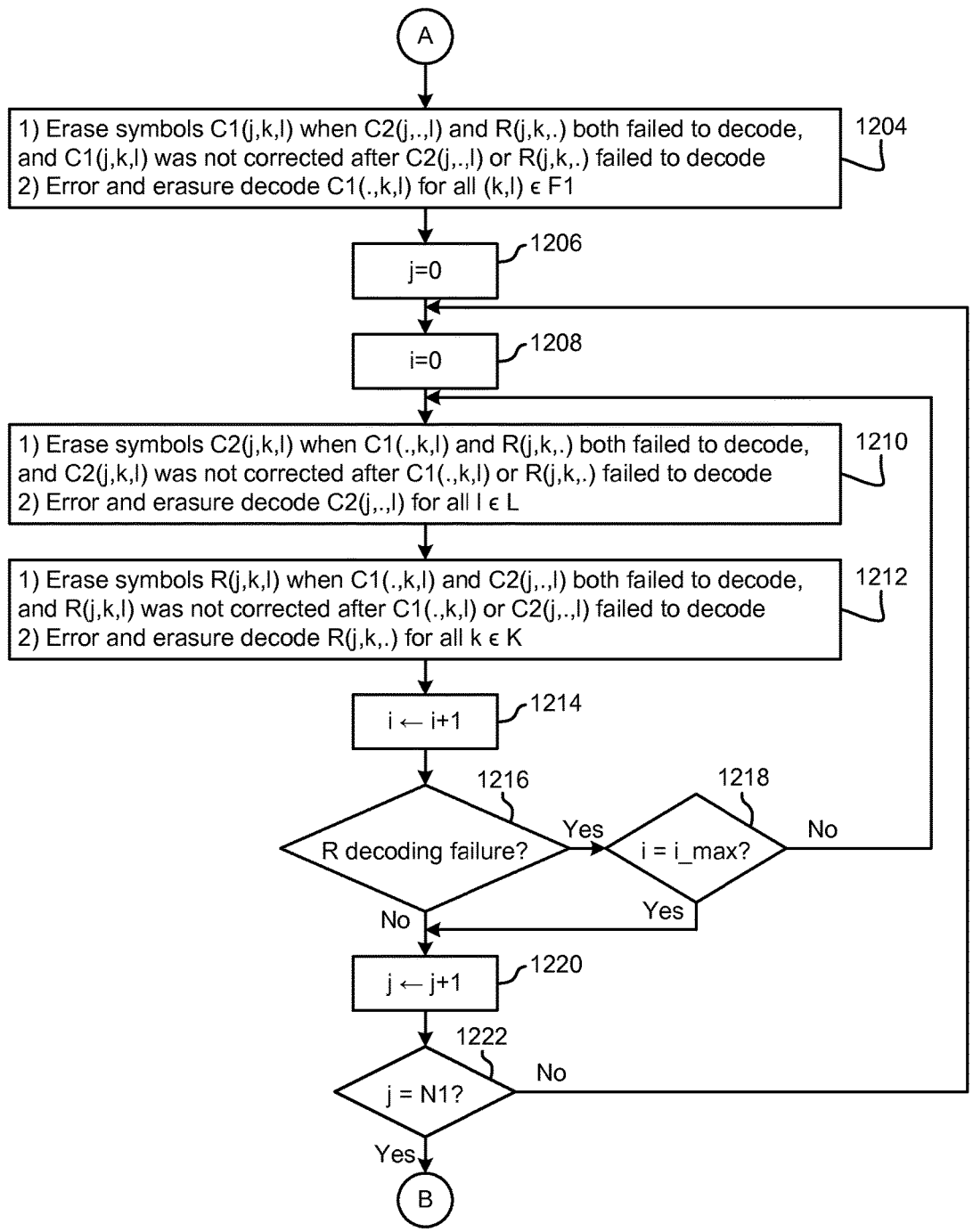

Now referring to FIGS. 12A-12B, a decoding method 1200 is shown according to one embodiment. The method 1200 may be executed in and/or with the use of any of the environments, systems, apparatuses, and/or schemes described in FIGS. 1-6B, in various approaches. Furthermore, the method 1200 may include more or less operations than those specifically described with reference to FIGS. 12A-12B.

For the description of method 1200, during a first iteration of the method 1200, C1(j,k,l) are code symbols at location (j,k,l) detected during C1 decoding, C2(j,k,l) when at the first iteration are code symbols at location (j,k,l) detected during C2 decoding, and R(j,k,l) when at the first iteration are code symbols at location (j,k,l) detected during R decoding. After the first iteration, the detected code symbols may be erased and/or overwritten during subsequent iterations of method 1200.

In method 1200 three decoders are used in an iterative manner. As shown, C1 decoding is performed, followed by C2 and R decoding repeated in an inner loop, in an iterative fashion until valid codewords are produced, or a maximum number of inner or outer iterations are reached. Method 1200 generally erases a data symbol obtained in an attempt to decode a codeword in response to the other two orthogonal codewords intersecting at the data symbol being decoded previously failed to decode and the data symbol was not corrected after failure to decode the two orthogonal codewords.

In operation 1202, an outer iteration counter (o) is set to zero, and the parameters for the decoding are set, such that K includes a set of numbers {k|0≤k≤N2}, L includes a set of numbers {l|0≤l≤N3}, and F1 is an array K×L. After operation 1202, method 1200 continues to the inner section, which is described in FIG. 12B.

As shown in operation 1204 of FIG. 12B, all symbols at locations (j,k,l) that are decoded using the C1 code are erased when corresponding symbols at locations (j,.,l) decoded using the C2 code and symbols at locations (j,k,.) decoded using the R code fail to decode, e.g., C2(j,.,l) and R(j,k,.) both fail to decode, and the symbol at location (j,k,l) was not corrected after C2 decoding or R decoding failed to decode, e.g., C2(j,.,l) or R(j,k,.) failed to decode. Also, all symbols at locations (.,k,l) are error and erasure decoded using the C1 code for all (k,l) within the set F1, e.g., error and erasure decode C1(.,k,l) for all (k,l)∈F1.

In operation 1206, j is set to zero, j corresponding to a particular plane within the three-dimensional array that is being decoded.

In operation 1208, the inner iteration counter (i) is set to zero, e.g., i=0.

In operation 1210, all symbols at locations (j,k,l) that are decoded using the C2 code are erased when corresponding symbols at locations (.,k,l) decoded using the C1 code and symbols at locations (j,k,.) decoded using the R code fail to decode, e.g., C1(.,k,l) and R(j,k,.) both fail to decode, and the symbol at location (j,k,l) was not corrected after C1 decoding or R decoding failed to decode, e.g., C1(.,k,l) or R(j,k,.) failed to decode. Also, all symbols at locations (j,.,l) are error and erasure decoded using the C2 code for all l within the set L, e.g., error and erasure decode C2(j,.,l) for all l ∈ L.

In operation 1212, all symbols at locations (j,k,l) that are decoded using the R code are erased when corresponding symbols at locations (.,k,l) decoded using the C1 code and symbols at locations (j,.,l) decoded using the C2 code fail to decode, e.g., C1(.,k,l) and C2(j,.,l) both fail to decode, and the symbol at location (j,k,l) was not corrected after C1 decoding or C2 decoding failed to decode, e.g., C1(.,k,l) or C2(j,.,l) failed to decode. Also, all symbols at locations (j,k,.) are error and erasure decoded using the R code for all k within the set K, e.g., error and erasure decode R(j,k,.) for all k∈K.

In operation 1214, the inner iteration counter is increased by one, e.g., i←i+1.

In operation 1216, it is determined whether R decoding failed for any symbol (j,k,.). When R decoding failed for any symbol (j,k,.), method 1200 proceeds to operation 1218. When R decoding has not failed for all symbols (j,k,.), method 1200 proceeds to operation 1220 where j is increased by one, e.g., j←j+1.

In operation 1218, it is determined whether the inner iteration counter is equal to a maximum allowed number of inner iterations (i_max). The maximum allowed number of inner iterations may be determined based on processing capability, timing constraints on the length of the decoding operation, or any other conceivable factor that may lead to the decoding being limited to a certain number of iterations. In various embodiments, i_max may be set to 1, 2, 3, 5, 8, 12, etc.

When the inner iteration counter is equal to i_max, method 1200 continues to operation 1220 where j is increased by one, e.g., j←j+1. When the inner iteration counter is not equal to i_max (e.g., it is less than i_max), method 1200 returns to repeat operations 1210 and 1212. Again, the number of iterations performed may depend on any conceivable factor, and may be set based on past experience in decoding data with certain parameters and various code types.

In operation 1222, it is determined whether j is equal to N1, the number of symbols in the j direction of the three-dimensional array. When j is equal to N1, method 1200 proceeds to point B pointing to operation 1224 in FIG. 12A; otherwise, method 1200 returns to operation 1208 to reset the inner iteration counter to zero.

In operation 1224, the outer iteration counter is increased by one, e.g., o←o+1. Then, in operation 1226, it is determined whether the outer iteration counter is equal to a maximum allowed number of outer iterations (o_max). The maximum allowed number of outer iterations may be determined based on processing capability, timing constraints on the length of the decoding operation, or any other conceivable factor that may lead to the decoding being limited to a certain number of iterations. In various embodiments, o_max may be set to 1, 2, 3, 5, 8, 12, etc.

When the outer iteration counter is equal to o_max, method 1200 ends and the decoded data is output. When the outer iteration counter is not equal to o_max (e.g., it is less than o_max), method 1200 returns to point A to repeat the inner section. Again, the number of iterations performed may depend on any conceivable factor, and may be set based on past experience in decoding data with certain parameters and various code types.

Figure 13:
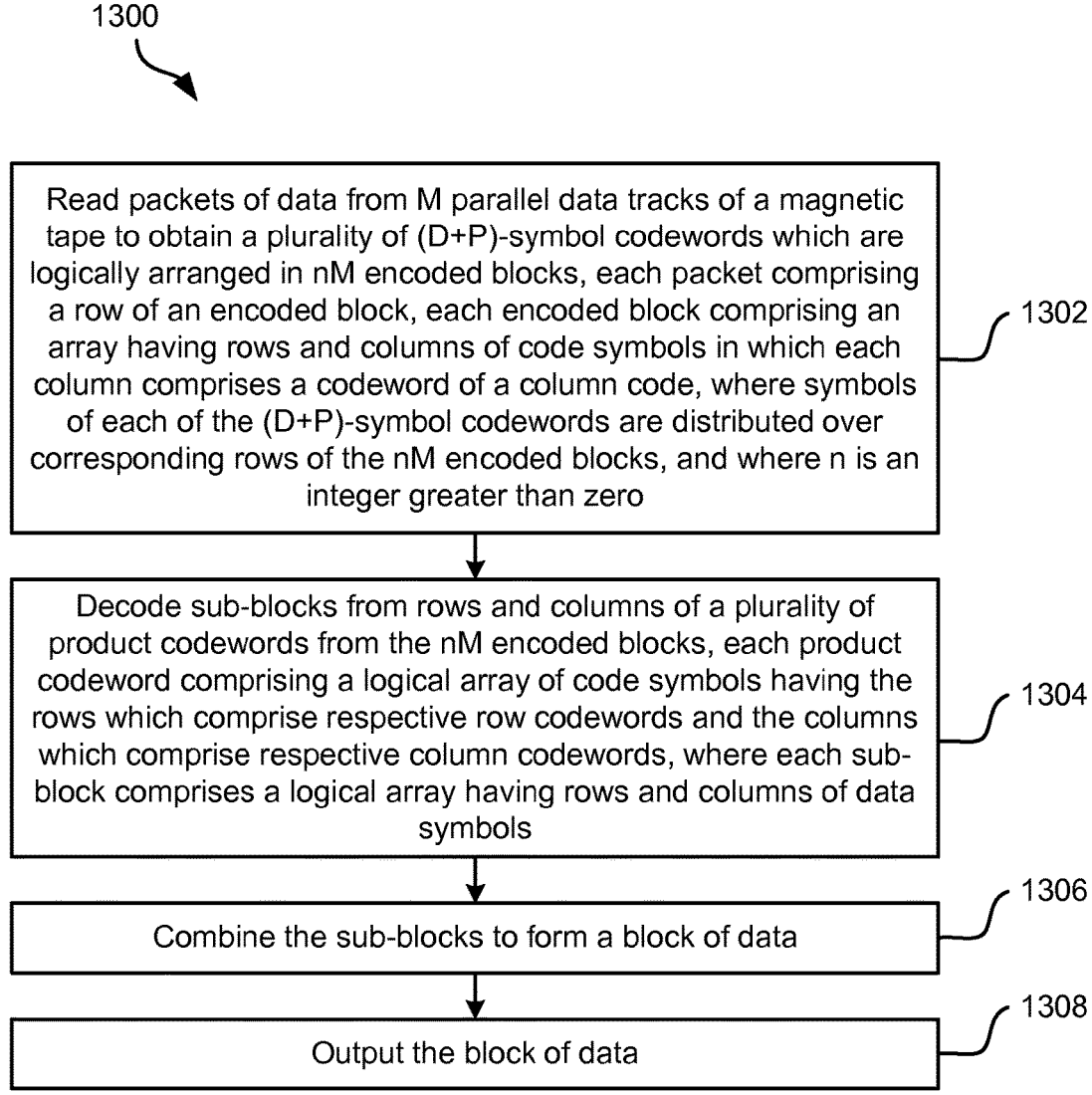
FIG. 13 is a flowchart of a method according to one embodiment.

Now referring to FIG. 13, a flowchart of a method 1300 is shown according to one embodiment. The method 1300 may be executed in and/or with the use of any of the environments, systems, apparatuses, and/or schemes described in FIGS. 1-12B, in various approaches. Furthermore, the method 1300 may include more or less operations than those specifically described with reference to FIG. 13, as would be understood by one of skill in the art upon reading the present descriptions.

Each of the steps of the method 1300 may be performed by any suitable component of the operating environment. For example, in various embodiments, the method 1300 may be partially or entirely performed by a magnetic tape drive, or some other device having one or more processors therein. The processor, e.g., processing circuit(s), chip(s), and/or module(s) implemented in hardware and/or software, and preferably having at least one hardware component may be utilized in any device to perform one or more steps of the method 1300. Illustrative processors include, but are not limited to, a central processing unit (CPU), an application specific integrated circuit (ASIC), a field programmable gate array (FPGA), etc., combinations thereof, or any other suitable computing device known in the art.

As shown, method 1300 may initiate with operation 1302, where packets of data are read, such as using one or more heads of a linear tape drive, from M parallel data tracks of a magnetic tape to obtain a plurality of (D+P)-symbol codewords which are logically arranged in nM encoded blocks. Each packet comprises, at least, a row of an encoded block. Each encoded block comprises an array having rows and columns of code symbols in which each column comprises a codeword of a column code, regardless of the direction used to determine columns of the array (j, k, or l direction). Symbols of each of the (D+P)-symbol codewords are distributed over corresponding rows of the nM encoded blocks, with n being an integer greater than zero, such as 1, 2, 4, 8, 16, 32, 64, etc.

In this embodiment, M is the number of channels of the linear tape drive, and n may be adjusted to account for whether PCW-based or SDS-based encoding is used to encode the data stored to the linear tape. In one embodiment, when SDS-based encoding is used, n may be set to 2, and D may be set to 63, 62, or some other number less than the total number of SDSs in a data set, which may be 64 in some embodiments.

In operation 1304, sub-blocks are decoded from rows and columns of a plurality of product codewords from the nM encoded blocks. These product codewords may be dispersed as arrays oriented in the j×k plane of a three-dimensional array, arrays oriented in the j×l plane of the three-dimensional array, or arrays oriented in the k×l plane of the three-dimensional array. Each product codeword comprises a logical array of code symbols having the rows which comprise respective row codewords and the columns which comprise respective column codewords. However, in this case, row codewords may be encoded using a C1, C2, or R code, and column codewords may be encoded using another of the C1, C2, or R code that is not used to encode the rows. Also, each sub-block comprises a logical array having rows and columns of data symbols.

In one embodiment, each sub-block may be a SDS comprising a plurality (such as 4) PCWs, which is used in SDS-based encoding. In another embodiment, each sub-block may be a PCW, which is used in PCW-based encoding.

In operation 1306, the sub-blocks are combined to form a block of data. The block of data may be a data set, as discussed previously.

In operation 1308, the block of data is output, such as by transmitting the block of data to a host via a host interface, or by some other output method understood by one of skill in the art.

In one embodiment, the sub-blocks may be decoded by repeating the following process until a maximum number of iterations is reached, or all codewords (C1, C2, and R) are successfully decoded. First, the row codewords of each product codeword are decoded using a row linear block code (in this embodiment, the C1 code). Next, the column codewords of each product codeword using a column linear block code (in this embodiment, the C2 code). Then, orthogonal codewords (codewords which are orthogonal to both the row and column codewords) which are arranged with one code symbol in each of the plurality of product codewords are decoded using a rate-D/(D+P) linear block code (in this embodiment, the orthogonal (R) code). Refer to FIGS. 9A-9B for more detail in this decoding process.

In one embodiment, the column codewords of each product codeword may be decoded prior to decoding the row codewords of each product codeword. This may be preceded by in one embodiment, or followed by in an alternate embodiment, the orthogonal codewords being decoded using the R code.

In another embodiment, the row codewords of each product codeword may be decoded prior to decoding the column codewords of each product codeword. This may be preceded by in one embodiment, or followed by in an alternate embodiment, the orthogonal codewords being decoded using the R code.

In yet another embodiment, the orthogonal codewords may be decoded prior to decoding the row codewords of each product codeword. This may be preceded by in one embodiment, or followed by in an alternate embodiment, the column codewords of each product codeword being decoded using the column code.

In one embodiment, the sub-blocks may be decoded by repeating the following process until a maximum number of iterations is reached, or all codewords (C1, C2, and R) are successfully decoded. First, for each inner iteration in an inner loop until a maximum number of inner iterations is reached: the row codewords of each product codeword are decoded using a row linear block code (C1 code) and the column codewords of each product codeword are decoded using a column linear block code (C2 code). Then, outside of this inner loop, orthogonal codewords are decoded which are arranged with one code symbol in each of the plurality of product codewords using a rate-D/(D+P) linear block code (orthogonal (R) code). Refer to FIGS. 10A-10B for more detail in this decoding process.

According to another embodiment, the sub-blocks may be decoded by repeating the following process until a maximum number of iterations is reached, or all codewords (C1, C2, and R) are successfully decoded. First, for each inner iteration in an inner loop until a maximum number of inner iterations is reached: the row codewords of each product codeword are decoded using a row linear block code (C1 code) and the orthogonal codewords which are arranged with one code symbol in each of the plurality of product codewords are decoded using a rate-D/(D+P) linear block code (orthogonal (R) code). Then, outside of this inner loop, column codewords of each product codeword are decoded using a column linear block code (C2 code). Refer to FIGS. 11A-11B for more detail in this decoding process.

According to yet another embodiment, the sub-blocks may be decoded by repeating the following process until a maximum number of iterations is reached, or all codewords (C1, C2, and R) are successfully decoded. First, the row codewords of each product codeword are decoded using a row linear block code (C1 code). Then, for each inner iteration in an inner loop until a maximum number of inner iterations is reached: the column codewords of each product codeword are decoded using a column linear block code (C2 code) and the orthogonal codewords which are arranged with one code symbol in each of the plurality of product codewords are decoded using a rate-D/(D+P) linear block code (orthogonal (R) code). Refer to FIGS. 12A-12B for more detail in this decoding process.

Referring again to FIG. 13, method 1300 may be executed in a system, in one embodiment. In another embodiment, method 1300 may be executed in a computer program product. The computer program product may be configured for decoding data stored to magnetic tape using three decoders in an iterative manner. The computer program product may comprise a computer readable storage medium having program instructions embodied therewith, the program instructions executable by a processor to cause the processor to perform method 1300.

There are several benefits to the methods and processes disclosed herein. One such benefit is improved online decoding because additional error patterns may be corrected as a result of coding orthogonal product codewords or SDSs, e.g., the use of three orthogonal product codewords. Another such benefit is improved offline decoding by using alternative decoding strategies (e.g., decoding across different planes) during error recovery procedure (ERP). Yet another such benefit is the capability to detect decoding errors in a data set (DS) due to miscorrections.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Moreover, a system according to various embodiments may include a processor and logic integrated with and/or executable by the processor, the logic being configured to perform one or more of the process steps recited herein. By integrated with, what is meant is that the processor has logic embedded therewith as hardware logic, such as an application specific integrated circuit (ASIC), a FPGA, etc. By executable by the processor, what is meant is that the logic is hardware logic; software logic such as firmware, part of an operating system, part of an application program; etc., or some combination of hardware and software logic that is accessible by the processor and configured to cause the processor to perform some functionality upon execution by the processor. Software logic may be stored on local and/or remote memory of any memory type, as known in the art. Any processor known in the art may be used, such as a software processor module and/or a hardware processor such as an ASIC, a FPGA, a central processing unit (CPU), an integrated circuit (IC), a graphics processing unit (GPU), etc.

It will be clear that the various features of the foregoing systems and/or methodologies may be combined in any way, creating a plurality of combinations from the descriptions presented above.

It will be further appreciated that embodiments of the present invention may be provided in the form of a service deployed on behalf of a customer to offer service on demand.

While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

What is claimed is:

1. A computer program product for reading data from a magnetic tape, the computer program product comprising a computer readable storage medium having program instructions embodied therewith, the embodied program instructions executable by a processor of a linear tape drive to cause the processor to:
   read, by the processor, packets of data from M parallel data tracks of the magnetic tape to obtain a plurality of (D+P)-symbol codewords which are logically arranged in nM encoded blocks, each packet comprising a row of an encoded block, wherein D is a number of data symbols and P is a number of parity symbols in each (D+P)-symbol codeword, wherein each encoded block comprises an array having rows and columns of code symbols in which each column comprises a codeword of a column code, wherein symbols of each of the (D+P)-symbol codewords are distributed over corresponding rows of the nM encoded blocks, and wherein n is an integer greater than zero;
   decode, by the processor, sub-blocks from rows and columns of a plurality of product codewords from the nM encoded blocks, each product codeword comprising a logical array of code symbols having the rows which comprise respective row codewords and the columns which comprise respective column codewords, wherein each sub-block comprises a logical array having rows and columns of data symbols;
   combine, by the processor, the sub-blocks to form a block of data; and
   output, by the processor, the block of data.

2. The computer program product as recited in claim 1, wherein the embodied program instructions executable by the processor to decode the sub-blocks from the rows and the columns of each of the plurality of product codewords is further configured to, for each iteration in an iterative process until a maximum number of iterations is reached or all codewords are successfully decoded:
   decode, by the processor, the row codewords of each product codeword using a row linear block code (C1 code);
   decode, by the processor, the column codewords of each product codeword using a column linear block code (C2 code); and
   decode, by the processor, orthogonal codewords which are arranged with one code symbol in each of the plurality of product codewords using a rate-D/(D+P) linear block code (orthogonal code).

3. The computer program product as recited in claim 2, wherein the column codewords of each product codeword are decoded prior to decoding the orthogonal codewords.

4. The computer program product as recited in claim 2, wherein the orthogonal codewords are decoded prior to decoding the column codewords of each product codeword.

5. The computer program product as recited in claim 2, wherein the row codewords of each product codeword are decoded prior to decoding the orthogonal codewords.

6. The computer program product as recited in claim 1, wherein the embodied program instructions executable by the processor to decode the sub-blocks from the rows and the columns of each of the plurality of product codewords is further configured to, for each iteration in an iterative process until a maximum number of iterations is reached or all codewords are successfully decoded:
   for each inner iteration in an inner iterative process until a maximum number of inner iterations is reached:
      decode, by the processor, the row codewords of each product codeword using a row linear block code (C1 code); and
      decode, by the processor, the column codewords of each product codeword using a column linear block code (C2 code); and
   decode, by the processor, orthogonal codewords which are arranged with one code symbol in each of the plurality of product codewords using a rate-D/(D+P) linear block code (orthogonal code).

7. The computer program product as recited in claim 1, wherein the embodied program instructions executable by the processor to decode the sub-blocks from the rows and the columns of each of the plurality of product codewords is further configured to, for each iteration in an iterative process until a maximum number of iterations is reached or all codewords are successfully decoded:

for each inner iteration in an inner iterative process until a maximum number of inner iterations is reached:

decode, by the processor, the row codewords of each product codeword using a row linear block code (C1 code); and decode, by the processor, orthogonal codewords which are arranged with one code symbol in each of the plurality of product codewords using a rate-D/(D+P) linear block code (orthogonal code); and decode, by the processor, the column codewords of each product codeword using a column linear block code (C2 code).

8. The computer program product as recited in claim 1, wherein the embodied program instructions executable by the processor to decode the sub-blocks from the rows and the columns of each of the plurality of product codewords is further configured to, for each iteration in an iterative process until a maximum number of iterations is reached or all codewords are successfully decoded:

decode, by the processor, the row codewords of each product codeword using a row linear block code (C1 code);

for each inner iteration in an inner iterative process until a maximum number of inner iterations is reached:

decode, by the processor, the column codewords of each product codeword using a column linear block code (C2 code); and decode, by the processor, orthogonal codewords which are arranged with one code symbol in each of the plurality of product codewords using a rate-D/(D+P) linear block code (orthogonal code).

9. A linear tape drive, comprising a processor and logic integrated with the processor, executable by the processor, or integrated with and executable by the processor, the logic being configured to cause the processor to:

read packets of data from M parallel data tracks of a magnetic tape to obtain a plurality of (D+P)-symbol codewords which are logically arranged in nM encoded blocks, each packet comprising a row of an encoded block, wherein D is a number of data symbols and P is a number of parity symbols in each (D+P)-symbol codeword, wherein each encoded block comprises an array having rows and columns of code symbols in which each column comprises a codeword of a column code, wherein symbols of each of the (D+P)-symbol codewords are distributed over corresponding rows of the nM encoded blocks, and wherein n is an integer greater than zero;

decode sub-blocks from rows and columns of a plurality of product codewords from the nM encoded blocks, each product codeword comprising a logical array of code symbols having the rows which comprise respective row codewords and the columns which comprise respective column codewords, wherein each sub-block comprises a logical array having rows and columns of data symbols;

combine the sub-blocks to form a block of data; and output the block of data.

10. The linear tape drive as recited in claim 9, wherein the logic configured to decode the sub-blocks from the rows and the columns of each of the plurality of product codewords is further configured to, for each iteration in an iterative process until a maximum number of iterations is reached or all codewords are successfully decoded:

decode the row codewords of each product codeword using a row linear block code (C1 code);

decode the column codewords of each product codeword using a column linear block code (C2 code); and decode orthogonal codewords which are arranged with one code symbol in each of the plurality of product codewords using a rate-D/(D+P) linear block code (orthogonal code).

11. The linear tape drive as recited in claim 10, wherein the column codewords of each product codeword are decoded prior to decoding the row codewords of each product codeword.

12. The linear tape drive as recited in claim 10, wherein the row codewords of each product codeword are decoded prior to decoding the column codewords of each product codeword.

13. The linear tape drive as recited in claim 10, wherein the orthogonal codewords are decoded prior to decoding the row codewords of each product codeword.

14. The linear tape drive as recited in claim 9, wherein the logic configured to decode the sub-blocks from the rows and the columns of each of the plurality of product codewords is further configured to, for each iteration in an iterative process until a maximum number of iterations is reached or all codewords are successfully decoded:

for each inner iteration in an inner iterative process until a maximum number of inner iterations is reached:

decode the row codewords of each product codeword using a row linear block code (C1 code); and decode the column codewords of each product codeword using a column linear block code (C2 code); and decode orthogonal codewords which are arranged with one code symbol in each of the plurality of product codewords using a rate-D/(D+P) linear block code (orthogonal code).

15. The linear tape drive as recited in claim 9, wherein the logic configured to decode the sub-blocks from the rows and the columns of each of the plurality of product codewords is further configured to, for each iteration in an iterative process until a maximum number of iterations is reached or all codewords are successfully decoded:

for each inner iteration in an inner iterative process until a maximum number of inner iterations is reached:

decode the row codewords of each product codeword using a row linear block code (C1 code); and decode orthogonal codewords which are arranged with one code symbol in each of the plurality of product codewords using a rate-D/(D+P) linear block code (orthogonal code); and decode the column codewords of each product codeword using a column linear block code (C2 code).

16. The linear tape drive as recited in claim 9, wherein the logic configured to decode the sub-blocks from the rows and the columns of each of the plurality of product codewords is further configured to, for each iteration in an iterative process until a maximum number of iterations is reached or all codewords are successfully decoded:

decode, by the processor, the row codewords of each product codeword using a row linear block code (C1 code);

for each inner iteration in an inner iterative process until a maximum number of inner iterations is reached:

decode, by the processor, the column codewords of each product codeword using a column linear block code (C2 code); and decode, by the processor, orthogonal codewords which are arranged with one code symbol in each of the plurality of product codewords using a rate-D/(D+P) linear block code (orthogonal code).

17. A method for reading data from a magnetic tape using a linear tape drive, the method comprising:

reading packets of data from M parallel data tracks of the magnetic tape to obtain a plurality of (D+P)-symbol codewords which are logically arranged in nM encoded blocks, each packet comprising a row of an encoded block, wherein D is a number of data symbols and P is a number of parity symbols in each (D+P)-symbol codeword, wherein each encoded block comprises an array having rows and columns of code symbols in which each column comprises a codeword of a column code, wherein symbols of each of the (D+P)-symbol codewords are distributed over corresponding rows of the nM encoded blocks, and wherein n is an integer greater than zero;

decoding sub-blocks from rows and columns of a plurality of product codewords from the nM encoded blocks, each product codeword comprising a logical array of code symbols having the rows which comprise respective row codewords and the columns which comprise respective column codewords, wherein each sub-block comprises a logical array having rows and columns of data symbols;

combining the sub-blocks to form a block of data; and
outputting the block of data.

18. The method as recited in claim 17, wherein the decoding the sub-blocks from the rows and the columns of each of the plurality of product codewords comprises, for each iteration in an iterative process until a maximum number of iterations is reached or all codewords are successfully decoded:

decoding the row codewords of each product codeword using a row linear block code (C1 code);
decoding the column codewords of each product codeword using a column linear block code (C2 code); and
decoding orthogonal codewords which are arranged with one code symbol in each of the plurality of product codewords using a rate-D/(D+P) linear block code (orthogonal code).

19. The method as recited in claim 17, wherein the decoding the sub-blocks from the rows and the columns of each of the plurality of product codewords comprises, for each iteration in an iterative process until a maximum number of iterations is reached or all codewords are successfully decoded:

for each inner iteration in an inner iterative process until a maximum number of inner iterations is reached:
decoding the row codewords of each product codeword using a row linear block code (C1 code); and
decoding the column codewords of each product codeword using a column linear block code (C2 code); and
decoding orthogonal codewords which are arranged with one code symbol in each of the plurality of product codewords using a rate-D/(D+P) linear block code (orthogonal code).

20. The method as recited in claim 17, wherein the decoding the sub-blocks from the rows and the columns of each of the plurality of product codewords comprises, for each iteration in an iterative process until a maximum number of iterations is reached or all codewords are successfully decoded:

for each inner iteration in an inner iterative process until a maximum number of inner iterations is reached:
decoding the row codewords of each product codeword using a row linear block code (C1 code); and
decoding orthogonal codewords which are arranged with one code symbol in each of the plurality of product codewords using a rate-D/(D+P) linear block code (orthogonal code); and
decoding the column codewords of each product codeword using a column linear block code (C2 code).

21. The method as recited in claim 17, wherein the decoding the sub-blocks from the rows and the columns of each of the plurality of product codewords comprises, for each iteration in an iterative process until a maximum number of iterations is reached or all codewords are successfully decoded:

decoding the row codewords of each product codeword using a row linear block code (C1 code);
for each inner iteration in an inner iterative process until a maximum number of inner iterations is reached:
decoding the column codewords of each product codeword using a column linear block code (C2 code); and
decoding orthogonal codewords which are arranged with one code symbol in each of the plurality of product codewords using a rate-D/(D+P) linear block code (orthogonal code).

* * * * *